United States Patent
Han et al.

(10) Patent No.: US 10,790,342 B2
(45) Date of Patent: Sep. 29, 2020

(54) DISPLAY DEVICE

(71) Applicant: SAMSUNG DISPLAY CO., LTD., Yongin-si, Gyeonggi-do (KR)

(72) Inventors: Jeong Yun Han, Yongin-si (KR); Jong Hwa Kim, Yongin-si (KR); Kyung Su Lee, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/409,034

(22) Filed: May 10, 2019

(65) Prior Publication Data
US 2020/0111843 A1 Apr. 9, 2020

(30) Foreign Application Priority Data

Oct. 5, 2018 (KR) .................... 10-2018-0119242

(51) Int. Cl.
*H01L 27/32* (2006.01)
*H01L 51/52* (2006.01)

(52) U.S. Cl.
CPC ........ *H01L 27/323* (2013.01); *H01L 27/3246* (2013.01); *H01L 27/3276* (2013.01); *H01L 51/5256* (2013.01)

(58) Field of Classification Search
CPC .............. H01L 27/323; H01L 27/3246; H01L 27/3276; H01L 51/5256
See application file for complete search history.

(56) References Cited

U.S. PATENT DOCUMENTS

| | | |
|---|---|---|
| 2016/0224156 A1 | 8/2016 | Ahn |
| 2017/0123557 A1 | 5/2017 | Na et al. |
| 2017/0262109 A1* | 9/2017 | Choi ................ G06F 3/0412 |
| 2017/0364194 A1 | 12/2017 | Jang et al. |
| 2018/0040672 A1* | 2/2018 | Park ................ H01L 27/3223 |
| 2018/0107316 A1 | 4/2018 | Hanari |
| 2018/0151662 A1* | 5/2018 | Rhe ................. H01L 27/323 |

(Continued)

FOREIGN PATENT DOCUMENTS

| | | |
|---|---|---|
| KR | 10-2016-0095594 | 8/2016 |
| KR | 10-2017-0052806 | 5/2017 |

(Continued)

OTHER PUBLICATIONS

U.S. Appl. No. 16/421,795 dated Jun. 4, 2020.

*Primary Examiner* — Michael Pervan
(74) *Attorney, Agent, or Firm* — F. Chau & Associates, LLC

(57) ABSTRACT

A display device includes a display panel that includes a substrate, a pixel disposed on the substrate, and an encapsulation layer that covers the pixel, and a touch sensor disposed on the display panel. The touch sensor includes sensing electrodes disposed on the encapsulation layer, and sensing lines respectively connected to the sensing electrodes. Each of the sensing lines includes a first sensing line pattern that extends onto the substrate, a second sensing line pattern connected to the first sensing line pattern outside of the encapsulation region, the second sensing line pattern including a first connection part and a second connection part, and a third sensing line pattern connected to the second connection part of the second sensing line pattern at a lower side of the encapsulation layer.

20 Claims, 11 Drawing Sheets

(56) References Cited

U.S. PATENT DOCUMENTS

2018/0158890 A1\*  6/2018  Chang ................. H01L 27/1248
2018/0373359 A1   12/2018  Han et al.
2020/0105840 A1\*  4/2020  Choi ................... H01L 51/5253

FOREIGN PATENT DOCUMENTS

| KR | 10-2017-0106621 | 9/2017 |
| KR | 10-1786119 | 10/2017 |
| KR | 10-2017-0142243 | 12/2017 |
| KR | 10-2018-0015326 | 2/2018 |
| KR | 10-2018-0059633 | 6/2018 |
| KR | 10-2018-0064600 | 6/2018 |
| WO | WO 2010/099132 | 9/2010 |

\* cited by examiner

DISPLAY DEVICE

CROSS-REFERENCE TO RELATED APPLICATION

The present application claims priority under 35 U.S.C. § 119(a) from, and the benefit of, Korean patent application 10-2018-0119242, filed on Oct. 5, 2018 in the Korean Intellectual Property Office, the contents of which are herein incorporated by reference in their entirety.

BACKGROUND

Technical Field

Embodiments of the present disclosure are directed to a display device, and more particularly, to a display device that includes a touch sensor.

Discussion of the Related Art

In general, a display device includes pixels disposed in a display region and a driving u nit disposed in a non-display region, and the pixels and the driving unit are connected through lines.

A display device may include a touch sensor that covers the display region, to serve as a touch display device. A user inputs information by touching an image displayed in the display region of the touch display device.

However, as display devices have increased resolution and include touch sensors, the number of lines disposed in the non-display region increases. Recently, studies have been conducted to reduce the area of a non-display region and the area of a dead space, which otherwise increase in size due to the increased number of lines.

SUMMARY

Embodiments provide a display device that includes sensing lines that include a second sensing line pattern that include a part extending to a lower side of an encapsulation layer at the outside of the encapsulation layer, and a third sensing line pattern that connects the sensing lines at the lower side of the encapsulation layer.

According to an embodiment of the present disclosure, there is provided a display device, including: a display panel that includes a substrate, a pixel disposed on the substrate, and an encapsulation layer that covers the pixel, the display panel including a display region that includes the pixel, an encapsulation region that corresponds to a position of the encapsulation layer, and a non-display region provided at at least one side of the display region; and a touch sensor disposed on the display panel. The touch sensor includes: sensing electrodes disposed on the encapsulation layer; and sensing lines respectively connected to the sensing electrodes on the encapsulation layer. Some of the sensing lines include: a first sensing line pattern that extends from one end of the encapsulation layer and onto the substrate; a second sensing line pattern connected to the first sensing line pattern outside of the encapsulation region, the second sensing line pattern including a first connection part that extends in a first direction and a second connection part that extends in a direction opposite to the first direction to a lower side of the encapsulation layer; and a third sensing line pattern connected to the second connection part of the second sensing line pattern at the lower side of the encapsulation layer, the third sensing line pattern extending in a second direction that crosses the first direction.

The first sensing line pattern, the second sensing line pattern, and the third sensing line pattern may be disposed on different insulating layers. The third sensing line pattern may be disposed in the encapsulation region.

The display panel may further include at least one insulating layer interposed between the second sensing line pattern and the third sensing line pattern. The at least one insulating layer may have a contact hole that overlaps one end portion of the second connection part. The one end portion of the second connection part and the third sensing line pattern may be connected to each other through the contact hole.

The contact hole may be formed in the encapsulation region.

Other sensing lines may include: the first sensing line pattern; and a fourth sensing line pattern that includes a first end portion connected to the first sensing line pattern outside of the encapsulation region, the fourth sensing line pattern extending in the direction opposite the first direction.

A second end portion of the fourth sensing line pattern may be connected to the third sensing line pattern.

The second sensing line pattern and the fourth sensing line pattern may be disposed on the same layer.

The non-display region of the display panel may include a bent region at one side of the non-display region and a connection region between the encapsulation region and the bent region.

The first sensing line pattern may extend to the connection region. One end portion of the first sensing line pattern may include a first pad disposed in the connection region.

The second sensing line pattern may include a second pad disposed between the first connection part and the second connection part. When viewed on a plane, the first pad and the second pad corresponding thereto may overlap each other.

The display panel may further include at least one insulating layer interposed between the first sensing line pattern and the second sensing line pattern. The at least one insulating layer may have a contact hole where the first pad and the second pad overlap each other. The first pad and the second pad may be connected to each other through the contact hole.

The first end portion of the fourth sensing line pattern may include a third pad disposed in the connection region.

The display panel may further include at least one insulating layer interposed between the first sensing line pattern and the fourth sensing line pattern, the at least one insulating layer having a contact hole where the first pad and the third pad overlap each other. The first pad and the third pad may be connected to each other through the contact hole.

The second connection part of the second sensing line pattern may extend to the bent region.

The third sensing line pattern may be connected to one second sensing line pattern and a plurality of fourth sensing line patterns.

The sensing electrodes may form a plurality of sensor blocks. Each of the sensor blocks may include: a first sensing electrode; and i second sensing electrodes arranged in a column direction while being spaced apart from the first sensing electrode, where i is a natural number greater than 1. The sensing lines may include: a plurality of first sensing lines each connected to the first sensing electrode; and a plurality of second sensing lines each connecting a jth second sensor of an nth sensor block and an (i−j+1)th second sensor of an (n+1)th sensor block, wherein j is a natural number that is greater than or equal to 1 and less than or equal to i, and n is a natural number.

One group of the first sensing lines may include the first, second, and third sensing line patterns, and the other group of the first sensing lines may include the first, second, and fourth sensing line patterns. One group of the second sensing lines may include the first, second, and third sensing line patterns, and the other group of the second sensing lines may include the first, second, and fourth sensing line patterns.

The pixel may include: a gate electrode disposed on the substrate; a first insulating layer that covers the gate electrode; and a source electrode and a drain electrode disposed on the first insulating layer. The second sensing line pattern may be disposed on the same layer as the source electrode and the drain electrode, and the third sensing line pattern may be disposed on the same layer as the gate electrode.

According to an embodiment of the present disclosure, there is provided a display device, including: a display panel that includes a display region and an encapsulation region that corresponds to an encapsulation layer that covers the display region; and a touch sensor disposed in the encapsulation region. The touch sensor includes: sensing electrodes disposed on the encapsulation layer; and sensing lines respectively connected to the sensing electrodes on the encapsulation layer. Some of the sensing lines include: a first sensing line pattern that extends away from one end of the encapsulation layer a second sensing line pattern connected to the first sensing line pattern outside of the encapsulation region, the second sensing line pattern including a first connection part that extends in a first direction and a second connection part that extends in a direction opposite to the first direction to a lower side of the encapsulation layer; and a third sensing line pattern connected to the second connection part of the second sensing line pattern at the lower side of the encapsulation layer, the third sensing line pattern extending in a second direction that crosses the first direction. Other sensing lines include: the first sensing line pattern; and a fourth sensing line pattern that includes a first end portion connected to the first sensing line pattern outside of the encapsulation region, the fourth sensing line pattern extending in the direction opposite to the first direction.

The display device may further include: a substrate, a pixel disposed on the substrate, wherein the display region includes the pixel and the encapsulation layer covers the pixel; and a non-display region provided at at least one side of the display region. The fourth sensing line pattern may further include a second end portion connected to the third sensing line pattern, the second sensing line pattern and the fourth sensing line pattern may be disposed on the same layer, and the third sensing line pattern may be connected to one second sensing line pattern and a plurality of fourth sensing line patterns.

According to embodiments of the present disclosure, a display device includes sensing lines that include second and fourth sensing line patterns that extend inside of the encapsulation region and a third sensing line pattern that connects the second and fourth sensing line patterns in the encapsulation region and is located on an insulating layer different from that of the second and fourth sensing line patterns, so that the number of sensing lines that extend into the bent region and the second flat region can be decreased. Thus, the degree of integration of lines in the bent region can be reduced and the number of pads of the touch sensor and the area of a dead space of the display panel can be decreased.

Further, the width of the additional region in the second direction can be reduced due to the decrease in the number of lines in the bent region. Accordingly, both side portions of the display device, which are not connected to the additional region, can be more easily bent or folded, e.g., to from a curved edge or a bent edge.

BRIEF DESCRIPTION OF THE DRAWINGS

Exemplary embodiments will now be described more fully hereinafter with h reference to the accompanying drawings; however, embodiments may take different forms and should not limited to exemplary embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout.

DETAILED DESCRIPTION

Figure 1A:
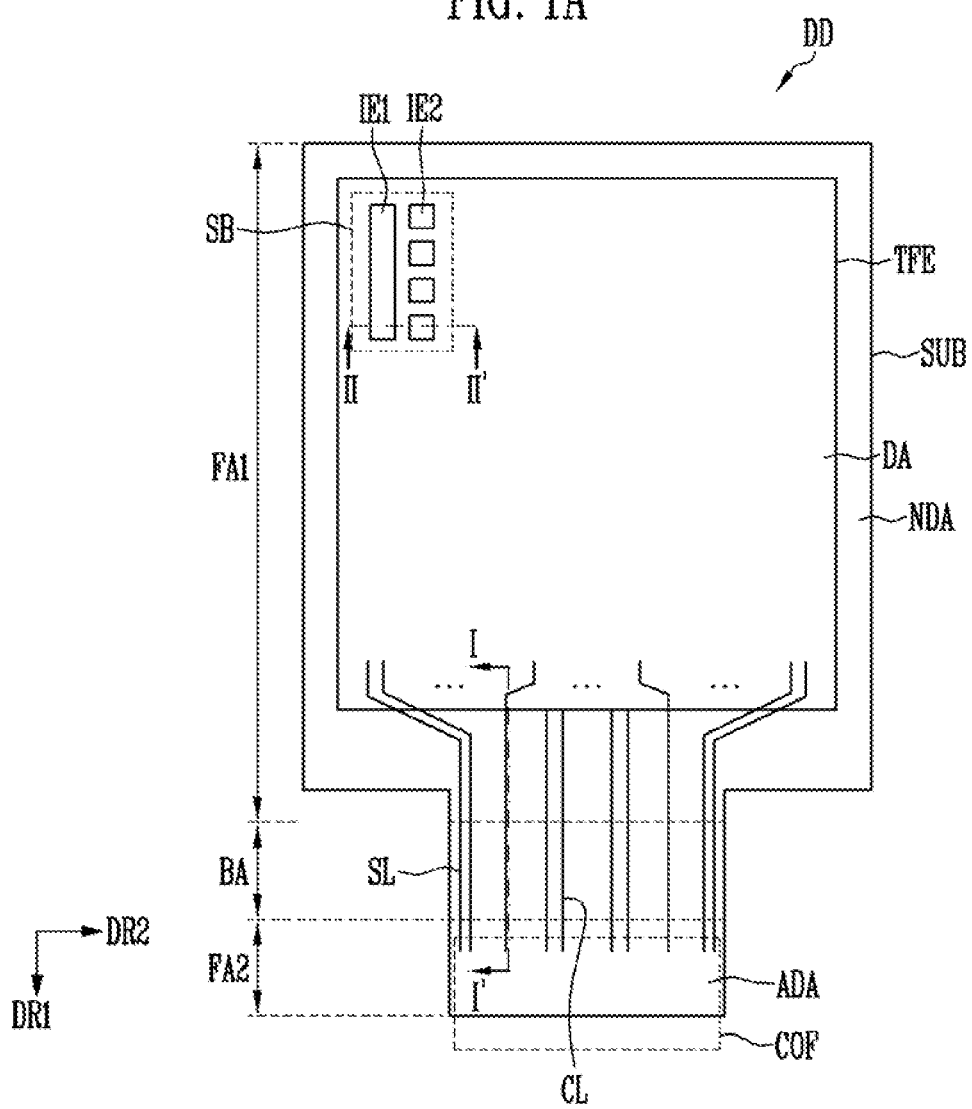
FIG. 1A is a plan view of a display device according to an embodiment of the present disclosure.

Hereinafter, exemplary embodiments of the present disclosure will be described in more detail with reference to the accompanying drawings. Throughout the drawings, the same reference numerals may be given to the same elements, and their overlapping descriptions will be omitted.

Figure 1B:
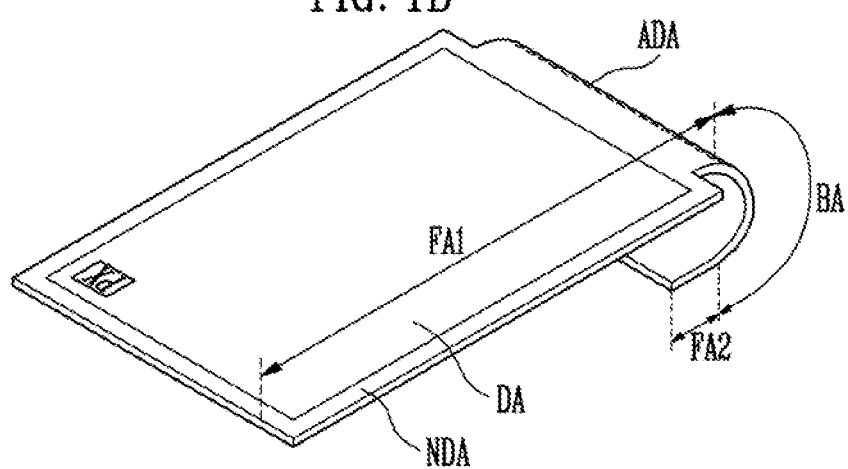
FIG. 1B is a perspective view of a display device of FIG. 1A.

FIG. 1A is a plan view of a display device according to an embodiment of the present disclosure. FIG. 1B is a perspective view of the display device of FIG. 1A.

Referring to FIGS. 1A and 1B, according to an embodiment, the display device DD includes a substrate SUB, pixels PX disposed on the substrate SUB, a display panel that has an encapsulation layer TFE covering the pixels PX, and a touch sensor disposed on the display panel.

According to an embodiment, the substrate SUB includes a display region DA and a non-display region NDA provided at at least one side of the display region DA.

According to an embodiment, the substrate SUB has an approximately rectangular shape. However, the shape of the substrate SUB is not limited thereto, and the substrate SUB may have different shapes in other embodiments. For example, the substrate SUB may have a closed polygon shape that includes linear sides, or a circular or an elliptical shape, etc., that include curved sides, or a semicircle a semi-ellipse, etc., that include linear and curved sides. In an embodiment, when the substrate SUB has linear sides at least some corners of the shapes are curved.

According to an embodiment, the display region DA is a region in which a plurality of pixels PX are disposed such that an image can be displayed. The display region DA has a shape that corresponds to that of the substrate SUB.

According to an embodiment, the pixels PX are disposed in the display region DA on the substrate SUB. Each pixel PX is a minimum unit for displaying an image, and a plurality of pixels are provided. The pixels PX emit white light or red light. Each pixel PX may emit any one of red, green, or blue light. However, embodiments of the present disclosure are not limited thereto and in other embodiments, the pixel PX can emit colors such as cyan, magenta or yellow light.

According to an embodiment, the pixels PX can be implemented as an organic light emitting element that includes an organic layer. However, embodiments of the present disclosure are not limited thereto, and in other embodiments, the pixels PX can be implemented as another type of display device, such as a liquid crystal device, an electrophoretic device, or an electro-wetting device.

According to an embodiment, the non-display region NDA is a region in which no pixels PX are provided, and is a region in which no image is displayed.

According to an embodiment, the non-display region NDA provided with conductive lines CL connected to the pixels PX and a driver that is connected to the conductive lines CL and drives the pixels PX.

According to an embodiment, the conductive lines provide a signal to each pixel PX, and include scan lines data lines, driving voltage lines, initialization lines, etc. In addition, the conductive lines CL may further include other lines, if necessary.

According to an embodiment, the conductive lines CL are provided throughout the display region DA and the non-display region NDA.

According to an embodiment, the driver includes a scan driver that transmits a scan signal to each pixel PX along a scan line, a data driver that transmits a data signal to each pixel PX along a data line, a timing controller that controls the scan driver and the data driver, etc.

In an embodiment, the scan driver mounted directly on the substrate SUB. In an embodiment, the scan driver is formed as a separate chip to be provided in the form of a chip on glass on the substrate SUB. In another embodiment, the scan driver is mounted on a printed circuit board to be connected to the substrate SUB through a connecting member.

In an embodiment, the data driver is mounted directly on the substrate SUB. In an embodiment, the data driver is formed as a separate chip to be connected to the substrate SUB. When the data driver is formed as a separate chip, the data driver may be provided in the form of a chip on glass, a chip on plastic, a chip on film (COF), etc. In other embodiments, the data driver is mounted on a printed circuit board to be connected to the substrate SUB through a connecting member.

In an embodiment, the non-display region NDA further includes an additional region ADA that protrudes from a side thereof. The additional region ADA protrudes from sides of the non-display region NDA. In an embodiment, the data driver or a touch driver are provided in or connected to the additional region ADA. However, embodiments of the present disclosure are not limited thereto, and in other embodiments, various other components are disposed in the additional region ADA. In addition, the data driver and the touch driver can be integrated as one driver.

In an embodiment, the display panel includes the encapsulation layer TFE that covers the display region DA and an encapsulation region that corresponds to the encapsulation layer TFE.

In an embodiment, the touch sensor includes sensing electrodes IE1 and IE2 and sensing lines SL disposed on the display panel. The sensing electrodes IE1 and IE2 are disposed on the encapsulation layer TFE. The sensing lines SL extend to one side of the substrate SUB from the encapsulation layer TFE.

In an embodiment, the sensing lines SL and the conductive lines CL extend on the substrate SUB but are not connected to or in contact with each other.

In an embodiment, at least a portion of the display device DD is flexible, and the display device DD can be folded at the flexible portion. That is, the display device DD includes a bent region BA that is flexible and can be bent in one direction, and a flat region provided at at least one side of the bendable region BA and that is flat without being bent. The flat region may or may not be flexible.

In an embodiment, a first flat region FA1 and a second flat region FA2 are provided, which are spaced apart from each other with the bent region BA interposed therebetween. The first flat region FA1 includes the display region DA. In an embodiment, the bent region BA is spaced apart from the display region DA.

In an embodiment, a line about which the display device DD is folded is referred to as a folding line, and the folding line is provided in the bent region BA. The term "folded" does not mean a fixed shape but means a shape deformable into another shape from the original shape, and includes a shape that is folded, curved, or rolled along at least one specific line i.e., a folding line.

In an embodiment, the data driver or the touch driver are disposed in the form of a chip on film in the second flat region FA2. In addition, a pad that connects the conductive lines CL and the driver and a pad that connects the sensing lines SL and the driver are disposed in the second flat region FA2.

Figure 2:
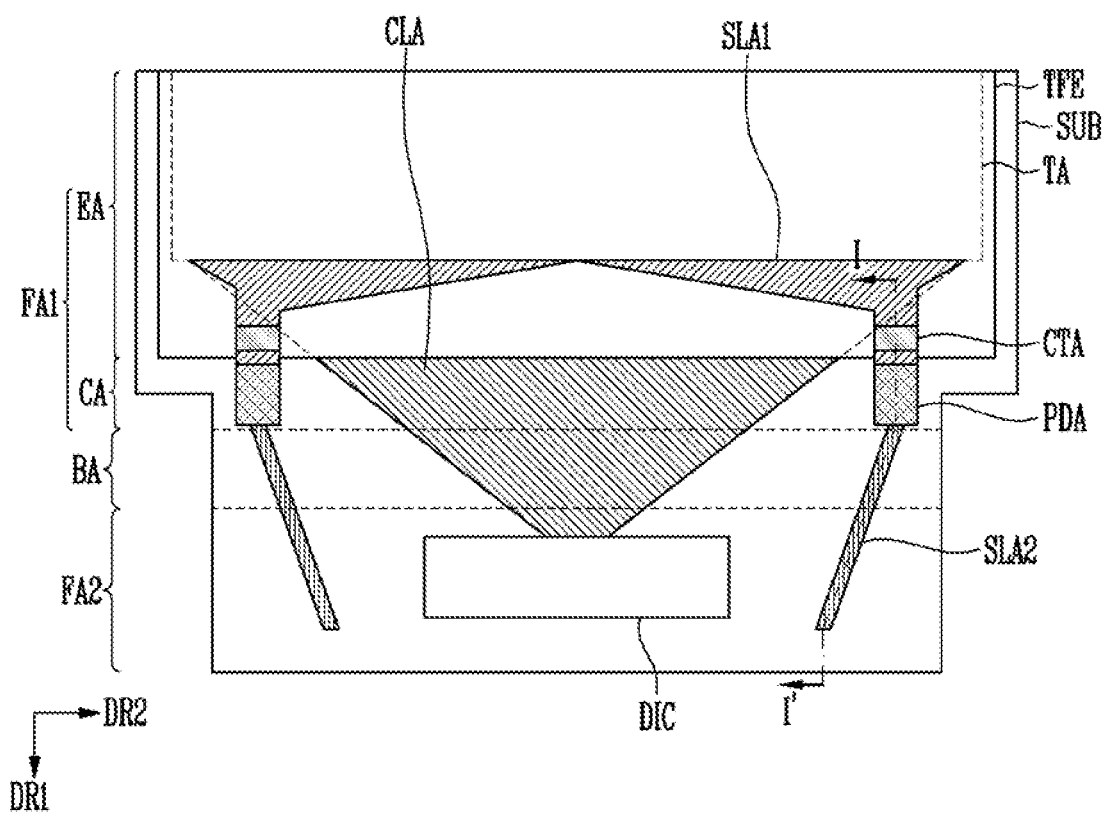
FIG. 2 is a plan view of a portion of a display device of FIG. 1A.

FIG. 2 is a plan view of a portion of the display device of FIG. 1A.

The position or shape of a region in which components included in the display device are approximately disposed will be schematically described in FIG. 2.

Referring to FIGS. 1A to 2, in an embodiment, the substrate SUB is divided into the flat regions FA1 and FA2 and the bent region BA.

In an embodiment, the bent region BA and the second flat region FA2 are located n the additional region ADA, and the bent region BA is located between the first flat region FA1 and the second flat region FA2.

In an embodiment, the first flat region FA1 includes an encapsulation region EA and a connection region CA. The encapsulation region EA corresponds to a region in which the encapsulation layer TFE is disposed.

In an embodiment, a plurality of conductive lines CL are disposed in a conductive line region CLA. The conductive lines CL are disposed between the encapsulation layer TFE and the substrate SUB. The conductive lines CL extend from the display region DA to a driver DIC through the conductive line region CLA to connect the pixels PX and the driver DIC.

In an embodiment, a touch active region TA of the touch sensor is located on the encapsulation layer TFE. Sensing electrodes IE1 and IE2 and sensing lines SL are disposed in the touch active region TA on the encapsulation layer TFE. The sensing lines SL extend in a first direction DR1 from the touch active region TA.

In an embodiment, the sensing lines SL are disposed along a first sensing line region SLA1 and a second sensing line region SLA2. For example the first sensing line region SLA1 is split along a left-right diagonal direction on the encapsulation layer TFE. In an example, some of the sensing lines SL include a segment that extends in a second direction DR2 or a diagonal direction between the second direction DR2 and the first direction DR1, and a segment that extends in the first direction DR1 from the former. Other sensing lines SL includes a segment that extends in a direction opposite to the second direction DR2 or a diagonal direction between the direction opposite to the second direction DR2 and the first direction DR1, and a segment that extends in the first direction DR1 from the former.

In an embodiment, the first sensing line region SLA1 extends up to the connection region CA. The connection region CA is located between the encapsulation region EA and the bent region BA. A pad region PDA is provided at at least a portion of the region where the connection region CA and the first sensing line region SLA1 overlap each other. Each of the sensing lines SL includes a pad in the pad region PDA, and a sensing line pattern that extends from the first sensing line region SLA1 and a sensing line pattern that extends from the second sensing line region SLA2 are electrically connected through the pad. That is, a sensing line on the encapsulation layer TFE extends through the pad region PDA of the connection region CA on a predetermined insulating layer on the substrate SUB.

In an embodiment, the conductive lines CL and the sensing lines SL are disposed in the same layer in the non-display region NDA but not in the encapsulation region EA. Therefore, as shown in FIG. 2, the conductive line region CLA and the first and second sensing line regions SLA1 and SLA2 do not overlap each other on the substrate SUB.

In an embodiment, the sensing lines SL disposed in the second sensing line region SLA2 extend up to the second flat region FA2 to be connected to the driver, such as a touch driver, disposed in the second flat region FA2. The second sensing line region SLA2 is provided in the bent region BA and the second flat region FA2. In an embodiment, the sensing lines SL disposed in the second sensing line region SLA2 extend in a diagonal direction with respect to the first direction DR1. However, this is merely illustrative and embodiments are not limited thereto, and in other embodiments, the sensing lines SL disposed in the second sensing line region SLA2 extend toward the driver in various other directions.

In an embodiment, only some of the sensing lines SL disposed in the first sensing line region SLA1 extend into the second sensing line region SLA2. That is, the number of sensing lines SL disposed in the second sensing line region SLA2 is less than the number of sensing lines disposed in the first sensing line region SLA1. Therefore, the number of sensing lines SL passing through the bent region BA is reduced.

For example, in an embodiment, the sensing lines SL in the pad region PDA additionally extend toward a contact region CTA. The sensing lines SL that extend to the contact region CTA extend to a lower side of the encapsulation layer TFE. Predetermined groups of sensing lines SL that extend into the contact region CTA are connected. Therefore a plurality of sensing lines SL can transmit one sensing signal or driving signal. A sensing line pattern that connects the sensing lines SL is not in contact with the conductive line CL.

That is, in an embodiment each sensing line group in the encapsulation region EA includes a plurality of connected sensing lines SL, so that the number of sensing lines SL that pass through the bent region BA can be decreased. Thus, the number of touch sensor pads and the dead space area can be decreased. Accordingly, the side portions of the display device DD, which are not connected to the additional region ADA, can be more easily bent or folded.

Figure 3:
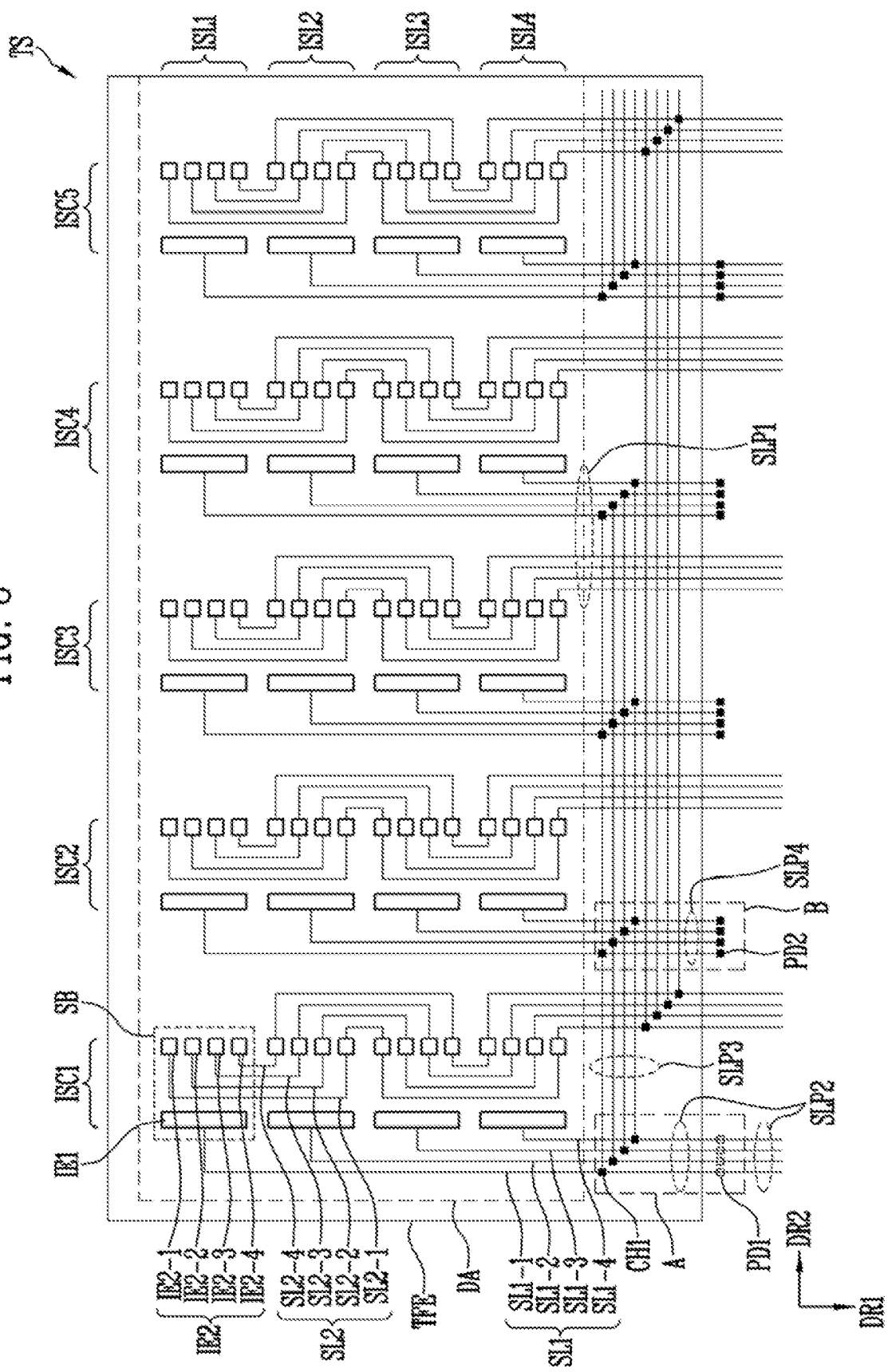
FIG. 3 illustrates an example of a touch sensor included in a display device of FIG. 1A.

FIG. 3 illustrates an example of a touch sensor included in a display device of FIG. 1A.

Referring to FIGS. 1A to 3, in an embodiment, the touch sensor TS include first sensing electrodes IE1, second sensing electrodes IE2-1 to IE2-4, and a plurality of sensing lines SL1 and SL2.

In an embodiment, the touch sensor TS includes a plurality of sensor blocks SB disposed in the touch active region TA. The sensor blocks SB form a plurality of sensor columns ISC1 to ISC5, or form a plurality of sensor rows ISL1 to ISL4. Each of the sensor columns ISC1 to ISC5 include a plurality of sensor blocks SB arranged in a first, column direction DR1. The sensor columns ISC1 to ISC5 are arranged in a second, row direction DR2. Although FIG. 3 shows a plurality of sensor blocks SB arranged in a matrix form, embodiments of the present disclosure are not limited thereto.

In an embodiment, each of the sensor blocks SB includes a first sensing electrode IE1 and i, where i is a natural number larger than 1, second sensing electrodes IE2-1 to IE2-4 that are disposed adjacent to the first sensing electrode IE1 and are arranged in a predetermined direction. The second sensing electrodes IE2-1 to IE2-4, for which i=4, are illustrated in FIG. 3. However, this is merely illustrative, and the number of second sensing electrodes included in the sensor block SB is not limited thereto in other embodiments, i second sensing electrodes IE2-1 to IE2-i constitute one sensor group. The direction in which the second sensing electrodes IE2-1 to IE2-i are arranged is substantially the same as the extending direction of the first sensing electrode IE1, i.e., the second sensing electrodes IE2-1 to IE2-i are arranged parallel to the first sensing electrode IE1.

In an embodiment, whether the sensor block SB includes "one first sensing electrode or a plurality of first sensing electrodes" is determined according to the number of first sensing electrodes IE1 electrically insulated from each other. Although the sensor block SB includes two conductive patterns, the two conductive patterns electrically connected by a sensing line form one first sensing electrode IE1. That is, among the first sensing electrodes IE1 shown in FIG. 3, four first sensing electrodes IE1 can serve as one first sensing electrode IE1 through a third sensing line pattern SLP3.

In an embodiment, this is identically applied to the second sensing electrode IE2. That is, the i second sensing electrodes IE2-1 to IE2-i shown in FIG. 3 are electrically separated from each other. For example, a second sensing electrode IE2-1 disposed in a first sensor column ISC1 can be electrically connected to a second sensing electrode disposed in a fifth sensor column ISC5, and these second sensing electrodes can serve as one second sensing electrode.

Hereinbelow the order of components increases as the sensor columns ISC1 to ISC5 go from the left to the right, as the sensor rows ISL1 to ISL4 go from the top to the bottom, and as the i second sensing electrodes IE2-1 to IE2-i go from the top to the bottom.

In an embodiment, when the second sensing electrodes IE2-1 to IE2-i receive a detection signal or transmission signal for external input detection, the first sensing electrode IE1 is capacitively coupled to the second sensing electrodes IE2-1 to IE2-i. When an input means, such as a finger, is disposed on one of the capacitively-coupled second sensing electrodes IE2-1 to IE2-I, capacitance between the first sensing electrode IE1 and the second sensing electrode changes. Coordinate information of the input means can be determined by detecting the changed capacitance from the specific second sensing electrode.

For example, in an embodiment, the first sensing electrode IE1 receives a detection signal for an external input. Therefore, when the changed capacitance is detected from the specific second sensing electrode, the coordinate information of the input means can be calculated.

A connection relationship according to an embodiment between the sensor blocks SB and the sensing lines SL1 and SL2 will be described based on the first sensor column ISC1 and a second sensor column ISC2.

In an embodiment, first sensing lines SL1-1 to SL1-4 are respectively connected to the first sensing electrodes IE1 of the sensor blocks SB of the first sensor column ISC1. Each of the first sensing lines SL1 includes a first sensing line pattern SLP1, a second sensing line pattern SLP2, and a third sensing line pattern SLP3, and include a first pad part PD1 that connects the first sensing line pattern SLP1 and the second sensing line pattern SLP2.

In an embodiment, the first sensing line pattern SLP1 is connected to the se rising electrodes IE1 and IE2 and extends in the first direction DR1. Therefore, the number of first sensing line patterns SLP1 may be equal to that of first and second sensing lines SL1 and SL2.

In an embodiment, the second sensing line pattern SLP2 is connected to the first sensing line pattern SLP1, and extends to the bent region BA. For example, the second sensing line pattern SLP2 approximately extends in the first direction DR1 outside of the encapsulation region EA. At least some of the second sensing line pattern SLP2 overlaps the first sensing line pattern SLP1.

In an embodiment, the first sensing lines SL1-1 to SL1-4 in the first sensor column ISC1 are respectively electrically connected to first sensing lines SL1-1 to SL1-4 in second to fourth sensor columns ISC2 to ISC4 through the third sensing fine patterns SLP3. That is, four first sensing lines SL1 in different sensor columns are electrically connected to each other.

In an embodiment, the third sensing line pattern SLP3 is formed in the encapsulation region EA. The third sensing line pattern SLP3 approximately extends in the second direction DR2. The third sensing line pattern SLP3 does not extend out of the encapsulation region EA.

In an embodiment, the first pad parts PD1 are aligned in the connection region CA outside of the encapsulation layer TFE.

In an embodiment, second sensing lines SL2-1 to SL2-4 connect a jth, where j is a natural number that is greater than or equal to 1 and less than or equal to i, second sensing electrode of an nth, where n is a natural number, sensor block of a sensor column and an (i−j+1)th second sensor electrode of an (n+1)th sensor block of the sensor column. Hereinbelow, this will be described in detail with reference to four second sensing lines SL2-1, SL2-2, SL2-3 and SL2-4 corresponding to the first sensor column ISC1.

In an embodiment, any one second sensing line SL2-1 can connect a first second sensing electrode IE2-1 of a first sensor block SB, a fourth second sensing electrode IE2-4 of a second sensor block SB, a first second sensing electrode IE2-1 of a third sensor block SB, and a fourth second sensing electrode IE2-4 of a fourth sensor block SB. Another second sensing line SL2-2 can connect a second second sensing electrode IE2-2 of the first sensor block SB, a third second sensing electrode IE2-3 of the second sensor block SB, a second second sensing electrode IE2-2 of the third sensor block SB, and a third second sensing electrode IE2-3 of the fourth sensor block SB.

In an embodiment, second sensing lines SL2 that correspond to the first sensor column ISC1 and second sensing lines SL2 that correspond to the fifth sensor column ISC5 are connected through the third sensing line pattern SLP3. The length of a third sensing line pattern SLP3 that connects the second sensing lines SL2 in the second direction DR2 is greater than that of a third sensing line pattern SLP3 that connects the first sensing lines SL1 in the second direction.

In an embodiment, each of the third sensing line patterns SLP3 connects i first sensing lines SL1 or i second sensing lines SL2. In this embodiment, one third sensing line pattern SLP3 connect four first sensing lines SL1 or four second sensing lines SL2. Accordingly, a number of second sensing line patterns SLP2 that extend into the bent region BA can be reduced to ¼ of the number of first sensing line patterns SLP1, i.e., first and second sensing lines SL1 and SL2.

In an embodiment, each of the first sensing lines SL1 connected to the first sensing electrode IE1 of the sensor blocks SB of the second sensor column ISC2 includes the first sensing line pattern SLP1 and a fourth sensing line pattern SLP4, and includes a second pad part PD2 that connects the first sensing line pattern SLP1 and the fourth sensing line pattern SLP4.

In an embodiment, the fourth sensing line pattern SLP4 is connected to the first sensing line pattern SLP1 through the second pad part PD2, and extends in a direction opposite to t he first direction DR1. That is, the fourth sensing line pattern SLP4 extends toward the display region DA.

In an embodiment, the second pad parts PD2 are aligned in the connection region CA outside of the encapsulation layer TFE.

In an embodiment, the fourth sensing line pattern SLP4 may be connected to the third sensing line pattern SLP3 through contact holes. Accordingly, the first sensing lines of the second sensor column ISC2 can respectively transmit the same signals as the first sensing lines SL1 of the first sensor column ISC1.

As described above, in an embodiment, the sensing electrodes IE1 and IE2 and the sensing lines SL1 and SL2 are formed on a same layer through a same process. The number of sensing lines SL1 and SL2 connected to the driver via the bent region BA is reduced to 1/i of the number of sensing lines SL1 and SL2 connected to the sensing electrodes IE1 and IE2.

Hereinafter, a configuration of the sensing lines SL1 and SL2 according to an embodiment will be described with reference to FIGS. 4 to 12.

Figure 4:
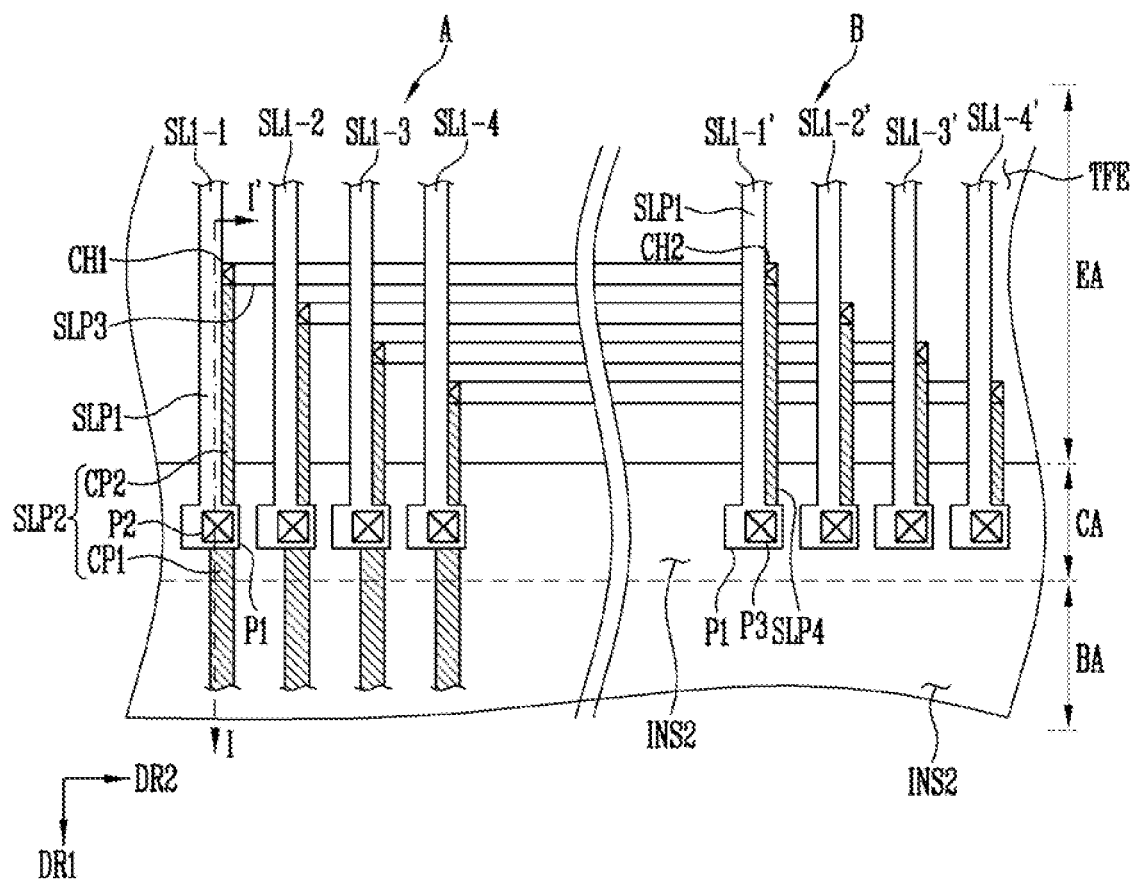
FIG. 4 is a plan view of an example of portions A and B of FIG.

FIG. 4 is a plan view of an example of portions R and B of FIG. 3.

Referring to FIGS. 3 and 4, according to an embodiment, some of the first sensing lines SL1, i.e., those in portion A, include a first sensing line pattern SLP1, a second sensing line pattern SLP2, and a third sensing line pattern SLP3, and other first sensing lines SL1, i.e., those in portion B, include a first sensing line pattern SLP1 and a fourth sensing line pattern SLP4.

In an embodiment, the first sensing line pattern SLP1, the second sensing line pattern SLP2, and the third sensing line pattern SLP3 are disposed on different insulating layers. In addition, the fourth sensing line pattern SLP4 are disposed on the same layer as the second sensing line pattern SLP2.

In an embodiment first sensing lines SL1-1 to SL1-4 disposed in portion A extend through the bent region BA, and first sensing lines SL1-1' to SL1-4' disposed at the portion B extend up to the connection region CA. However, this is merely illustrative, and embodiments are not limited thereto. Some of the first sensing lines SL1-1 to SL1-4 disposed in portion A and some of the first sensing lines SL1-1' to SL1-4 ' disposed in portion B extend through the bent region BA in other embodiments.

In an embodiment, the first sensing line pattern SLP1 connected to the sensing electrode IE1 passes through one end of the encapsulation layer TFE and then extends on the substrate. One end of the first sensing line pattern SLP1 is disposed in the connection region CA. The first sensing line pattern SLP1 is disposed on a second insulating layer INS2 in the connection region CA. One end portion of the first sensing line pattern SLP1 includes a first pad P1 disposed in the connection region CA.

In an embodiment, the first pads P1 of the first sensing line patterns SLP1 are disposed substantially parallel to the second direction DR2. However, this is merely illustrative, and adjacent first pads P1 may be disposed to alternate with each other with respect to the second direction DR2.

In an embodiment, the second sensing line pattern SLP2 is connected to the first sensing line pattern SLP1 outside of the encapsulation region EA. The second sensing line pattern SLP2 is connected to the first sensing line pattern SLP1 in the connection region CA. The second sensing line pattern SLP2 includes a first connection part CP1 that extends in the first direction DR1 and a second connection part CP2 that extends in a direction opposite to the first direction DR1 to extend under the encapsulation layer TFE.

In an embodiment, the second sensing line pattern SLP2 is disposed on an insulating layer different from that of the first sensing line pattern SLP1. In an embodiment, the first connection part CP1 and the second connection part CP2 are formed of the same material through the same process.

In an embodiment, the second sensing line pattern SLP2 includes a second pad P2 between the first connection part CP1 and the second connection part CP2. The second pad P2 is connected in the connection region CA. The first pad P1 and the second pad P2 overlap each other with at least one insulating layer interposed therebetween.

In an embodiment, the at least one insulating layer has a contact hole in a region in which the first pad P1 and the second pad P2 overlap each other, and the first pad P1 and the second pad P2 are connected to each other through the contact hole. Therefore, the first sensing line pattern SLP1 and the second sensing line pattern SLP2 are connected to each other. However, this is merely illustrative, and in other embodiments, the first pad P1 and the second pad P2 can be connected to each other through a plurality of contact holes.

In an embodiment, the first connection part CP1 of the second sensing line pattern SLP2 is disposed in and extend through the encapsulation region EA while avoiding other conductive lines CL. The conductive lines CL include scan lines, data lines, power lines, initialization lines, etc.

In an embodiment, the third sensing line pattern SLP3 is connected to the second connection part CP2 of the second sensing line pattern SLP2 under the encapsulation layer TFE, and extends in the second direction DR2. The third sensing line pattern SLP3 is disposed on an insulating layer different from that of the second sensing line pattern SLP2.

For example, according to an embodiment, at least one insulating layer is interposed between the second sensing line pattern SLP2 and the third sensing line pattern SLP3. The at least one insulating layer has a first contact hole CH1 where one end portion of the second connection part CP2 and the third sensing line pattern SLP3 overlap each other. The one end portion of the second connection part CP2 and the third sensing line pattern SLP3 are connected to each other through the first contact hole CH1. However, this is merely illustrative, and in other embodiments, the one end portion of the second connection part CP2 and the third sensing line pattern SLP3 can be connected to each other through a plurality of contact holes.

In an embodiment, the first contact hole CH1 is formed in the encapsulation region EA. In addition, the third sensing line pattern SLP3 is disposed only in the encapsulation region EA. Accordingly, the plurality of first sensing lines SL1-1 to SL1-4 and SL1-1' to SL1-4' are electrically connected in the encapsulation region EA.

In an embodiment, the third sensing line pattern SLP3 extends through the encapsulation region EA while avoiding other conductive lines CL.

In an embodiment, the first sensing lines SL1-1' to SL1-4' disposed at portion B include a first sensing line pattern SLP1 and a fourth sensing line pattern SLP4. The first sensing line SL1-1' to SL1-4' at portion B are respectively connected to the first sensing lines SL1-1 to SL1-4 disposed at portion A through the third sensing line patterns SLP3.

In an embodiment, the fourth sensing line pattern SLP4 is connected to the first sensing line pattern SLP1 in the connection region CA. The fourth sensing line pattern SLP4 includes a first end portion connected to the first sensing line pattern SLP1 in the connection region CA and a second end portion connected to the third sensing line pattern SLP3 in the encapsulation region EA.

In an embodiment, the first end portion of the fourth sensing line pattern SLP4 includes a third pad P3 disposed in the connection region CA. The third pad P3 is formed in the same layer through the same process as the second pad P2. The third pad P3 and the first pad P1 are connected to each other through a contact hole.

In an embodiment, at least one insulating layer is interposed between the fourth sensing line pattern SLP4 and the third sensing line pattern SLP3. The at least one insulating layer has a second contact hole CH2 where the second end portion of the fourth sensing line pattern SLP4 and the third sensing line pattern SLP3 overlap each other. The fourth sensing line pattern SLP4 and the third sensing line pattern SLP3 are connected to each other through the second contact hole CH2.

In an embodiment, the fourth sensing line pattern SLP4 extends in a direction opposite to the first direction DR1. For example, the fourth sensing line pattern SLP4 extends toward the display region DA.

In an embodiment, the fourth sensing line pattern SLP4 extends while avoiding other conductive lines CL. The conductive lines CL include scan lines, data lines, power lines, initialization lines, etc.

As described above, according to an embodiment, not all of the first sensing lines SL1-1 to SL1-4 and SL1-1' to SL1-4' are disposed in the bent region BA, and only those sensing lines that include the second sensing line pattern SLP2 are disposed in the bent region BA. For example, when n first sensing lines SL1 extend from the first sensing electrodes IE1, only n/i first sensing lines SL1 extend up to the driver, e.g., a touch driver, via the bent region BA. Thus, the number of pads of the touch sensor TS and the area of a dead space of the display panel can be reduced. Further, the width of the additional region ADA of FIG. 1 in the second direction DR2 can be reduced. Accordingly, both the side portions of the display device DD, which are not connected to the additional region ADA, can be more easily bent or folded.

Figure 5:
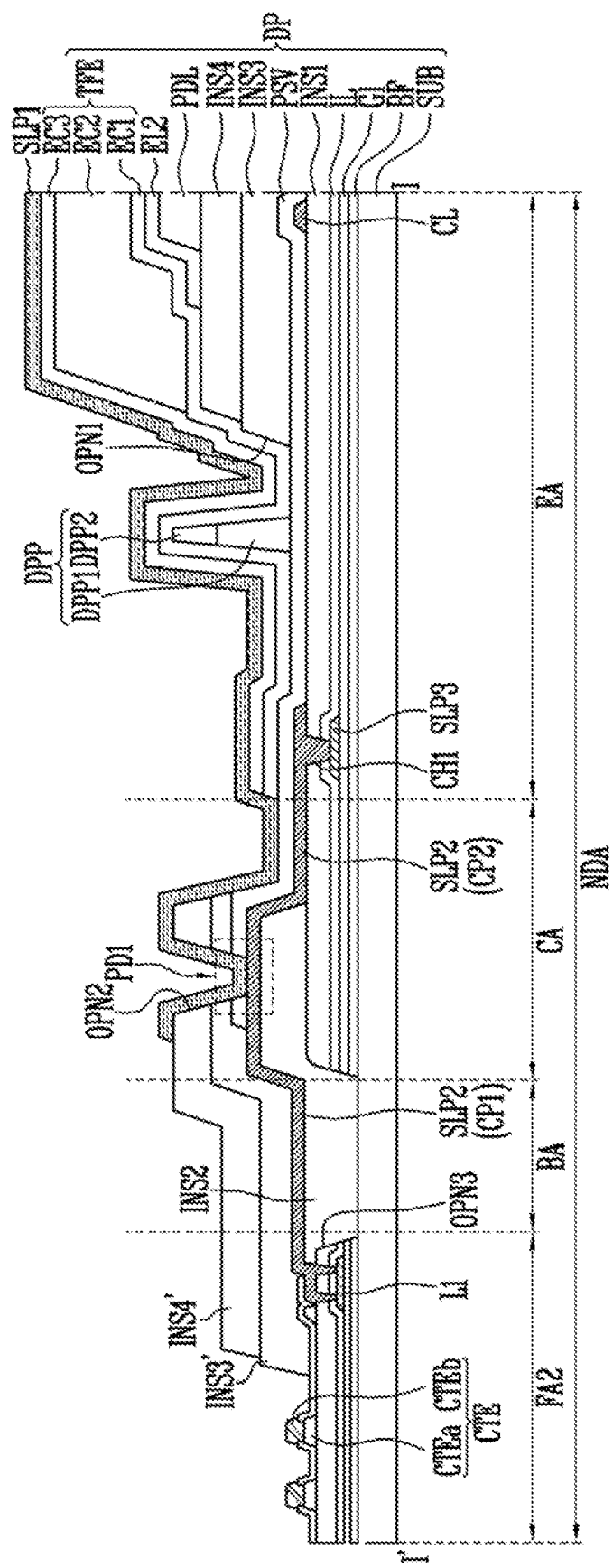
FIG. 5 is a sectional view of an example taken along line I-I' of FIG. 1A.
Figure 6:
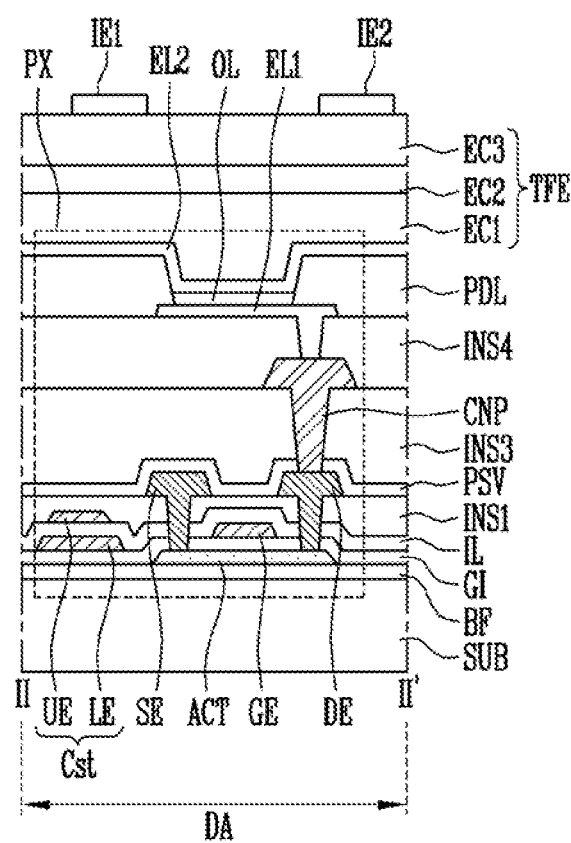
FIG. 6 s a sectional:view of an example taken along line II-II' of FIG. 1A.

FIG. 5 is a sectional view of an example taken along line I-I' of FIG. 1A. FIG. 6 is a sectional view of an example taken along line II-II' of FIG. 1A.

Referring to FIGS. 1A to 6, according to an embodiment, the display device DD includes a display panel DP and a touch sensor TS. The display device DD includes a display region DA and a non-display region NDA.

The display region DA will be first described, and the non-display region NDA will be then described.

As shown in FIG. 6, according to an embodiment, a plurality of pixels PX are disposed in the display region DA. Each pixel PX includes a transistor connected to a conductive line CL, a light emitting element connected to the transistor, and a capacitor Cst. The transistor may be a driving transistor that controls the light emitting element or a switching transistor that switches the driving transistor.

For convenience of description, an embodiment where one pixel PX is provided with one transistor and one capacitor is illustrated in FIG. 6. However, embodiments of the present disclosure are not limited thereto, and one pixel PX can be provided with two or more transistors and at least one capacitor, or three or more transistors and two or more capacitors.

In an embodiment, the pixel PX is disposed on a substrate SUB.

In an embodiment, the substrate SUB is made of an insulating material such as glass or resin. In addition, the substrate SUB includes a flexible material to be bendable or foldable. The substrate SUB may have a single- or multi-layered structure.

In an embodiment, a buffer layer BF may be formed on the substrate SUB. The buffer layer BF prevents impurities from diffusing into the switching and driving transistors. The buffer layer BF is an inorganic insulating layer made of an inorganic material. For example, the buffer layer BF may be formed of silicon nitride, silicon oxide, silicon oxynitride, or etc. The buffer layer BF may be omitted, depending on the materials and process conditions of the substrate SUB.

In an embodiment, an active pattern ACT is disposed on the buffer layer BF. The active pattern ACT is formed of a semiconductor material. The active pattern ACT includes a source region, a drain region, and a channel region between the source region and the drain region. The active pattern ACT is a semiconductor pattern made of poly-silicon, amorphous silicon, an oxide semiconductor, or etc.

In an embodiment, a gate insulating layer GI is disposed over is the active pattern ACT. The gate insulating layer GI is an inorganic insulating layer made of an inorganic material.

In an embodiment gate electrode GE and a capacitor lower electrode LE are disposed on the gate insulating layer GI. The gate electrode GE covers a region that corresponds to the channel region of the active pattern ACT.

In an embodiment, the gate electrode GE and the capacitor lower electrode LE are made of a metal. For example, the gate electrode GE is made of at least one of gold (Au), silver (Ag), aluminum (Al), molybdenum (Mo), chromium (Cr), titanium (Ti) nickel (Ni) neodymium (Nd), or copper (Cu) or alloys thereof. In addition, the gate electrode GE may have a single layer or a multi-layer structure in which two or more materials of the metals and alloys are stacked.

In an embodiment, at least some conductive lines CL that include scan lines are formed of the same material in the same layer as the gate electrode GE and the capacitor lower electrode LE. The conductive lines CL are directly or indirectly connected to a portion of the transistor, such as the gate electrode GE.

In an embodiment, an interlayer insulating layer IL is disposed over the gate electrode GE and the capacitor lower electrode LE. The interlayer insulating layer IL is an inorganic insulating layer made of an inorganic material. The inorganic material includes polysiloxane, silicon nitride, silicon oxide, silicon oxynitride, etc.

In an embodiment, a capacitor upper electrode UE is disposed on the interlayer insulating layer IL. The capacitor upper electrode UE is made of a metal. For example, the capacitor upper electrode UE is made of at least one of gold (Au), silver (Ag), aluminum (Al), molybdenum (Mo), chromium (Cr), titanium (Ti), nickel (Ni), neodymium (Nd), or copper (Cu), or alloys thereof. In addition, the capacitor upper electrode UE has a single layer. However, embodiments of the present disclosure are not limited thereto, and the capacitor upper electrode UE may have a multi-layered structure in which two or more metals or alloys are stacked.

In an embodiment, the capacitor lower electrode LE and the capacitor upper electrode UE constitute the capacitor Cst with the interlayer insulating layer IL interposed therebetween.

In an embodiment, a first insulating layer INS1 is disposed over the capacitor upper electrode UE. The first insulating layer INS1 is an inorganic insulating layer made of an inorganic material. The inorganic material includes polysiloxane, silicon nitride, silicon oxide, silicon oxynitride, etc.

In an embodiment, a source electrode SE and a drain electrode DE are disposed on the first insulating layer INS1. The source electrode SE and the drain electrode DE are in contact with the source region and the drain electrode of the active pattern ACT through contact holes formed in the first insulating layer INS1, the interlayer insulating layer IL, and the gate insulating layer GI, respectively.

In an embodiment, the source electrode SE and the drain electrode DE are made of a metal. For example, the source electrode SE and the drain electrode DE are made of at least one gold (Au), silver (Ag) aluminum (Al), molybdenum (Mo), chromium (Cr), titanium (Ti) nickel (Ni) neodymium (Nd), or copper (Cu), or alloys thereof.

In an embodiment, the conductive lines CL, such as the data lines initialization lines, some scan lines, and power lines are formed of the same material in the same layer as the source electrode SE and the drain electrode DE. The data lines or power lines can be directly or indirectly connected to portions of the transistor, such as the source electrode SE or the drain electrode DE in each pixel PX.

In an embodiment, a passivation layer PSV is disposed over the source electrode SE and the drain electrode DE. The passivation layer PSV is an inorganic insulating layer made of an inorganic material. The inorganic material includes polysiloxane, silicon nitride, silicon oxide, silicon oxynitride, etc.

In an embodiment, a third insulating layer INS3 is disposed on the passivation layer PSV. The third insulating layer INS3 is an organic insulating layer made of an organic material. The organic material includes an organic insulating material such as a polyacryl-based compound, a polyimide-based compound, a fluorine-based compound such as Teflon, or a benzocyclobutene-based compound.

In an embodiment, a connection pattern CNP is disposed on the third insulating layer INS3. The connection pattern CNP is connected to the drain electrode DE of the transistor through a contact hole that penetrates the third insulating layer INS3 and the passivation layer PSV. The connection pattern CNP is made of at least one of gold (Au) silver Ag), aluminum (Al), molybdenum (Mo), chromium (Cr), titanium (Ti), nickel (Ni), neodymium (Nd) or copper (Cu), or alloys thereof.

In an embodiment, other lines, such as a dummy power line, a data line, etc., are formed of the same material in the same layer as the connection pattern CNP.

In an embodiment, a fourth insulating layer INS4 is disposed over the connection pattern CNP. The fourth insulating layer INS4 is an organic insulating layer made of an organic material. The organic material includes an organic insulating material such as a polyacryl-based compound, a polyimide-based compound, a fluorine-based compound such as Teflon, or a benzocyclobutene-based compound.

In an embodiment, a first electrode EL1 is disposed on the fourth insulating layer INS4. The first electrode EL1 is connected to the connection pattern CNP through a contact hole that penetrates the fourth insulating layer INS4. In some embodiments, the first electrode EL1 is one of an anode or a cathode.

In FIG. 6, according to an embodiment, the passivation layer PSV, the third insulating layer INS3, and the fourth insulating layer INS4 are disposed over the drain electrode DE, but the arrangement of the insulating layers may be changed. For example, in some embodiments, only the passivation layer PSV is disposed over the drain electrode DE, and the first electrode EL1 is disposed on the passivation layer PSV. In other embodiments, only the passivation layer PSV and the third insulating layer INS3 are provided and the first electrode EL1 is disposed on the third insulating layer INS3. Therefore, the connection pattern CNP may be omitted, and the first electrode EL1 can be directly connected to the drain electrode DE.

In an embodiment, the first electrode EL1 is made of a metal, such as Ag, Mg, Al, Pt, Pd, Au, Ni, Nd, Ir, Cr, or any alloy thereof, etc. or indium tin oxide (ITO), indium zinc oxide (IZO), zinc oxide (ZnO) indium zinc oxide (ITZO), etc.

In an embodiment, a pixel defining layer PDL that delimits a pixel region to correspond to each pixel PX is disposed on the substrate SUB. The pixel defining layer PDL is an organic insulating layer made of an organic material. The organic material includes an organic insulating material such as a polyacryl-based compound, a polyimide-based compound, a fluorine-based compound such as Teflon, or a benzocyclobutene-based compound.

In an embodiment, the pixel defining layer PDL exposes an upper surface of the first electrode EL1 and protrudes from the substrate SUB along the circumference of the pixel PX.

In an embodiment, an organic layer OL is disposed in the pixel region and is surrounded by the pixel defining layer PDL. The organic layer OL may have a single layer, or may have multiple layers that include various functions. When the organic layer OL has multiple layers, the organic layer OL includes a hole injection layer (HIL), a hole transport layer (HTL), an emission layer (EML), an electron transport layer (ETL), an electron injection layer (EIL), that are stacked in a single or complex structure.

In an embodiment, a second electrode EL2 is disposed on the organic layer OL. The second electrode EL2 is provided for each pixel PX. However, the second electrode EL2 covers a majority of the display region DA, and is shared by the plurality of pixels PX.

In some embodiments, the second electrode EL2 is one of an anode and a cathode. When the first electrode EL1 is an anode, the second electrode EL2 is a cathode. When the first electrode EL1 is a cathode, the second electrode EL2 is an anode.

In an embodiment, the second electrode EL2 is made of a metal, such as Ag, Mg, Al, Pt, Pd, Au, Ni, Nd, Ir, Cr, etc. or a transparent conductive layer such as indium tin oxide (ITO), indium zinc oxide (IZO), zinc oxide (ZnO), indium tin zinc oxide (ITZO), etc. In an embodiment, the second electrode EL2 has a multi-layer structure that has two or more layers and includes a metal thin film. For example, the second electrode EL2 has a triple layer structure of ITO/Ag/ITO.

In an embodiment, an encapsulation layer TFE is disposed over the second electrode EL2. The encapsulation layer TFE may have a single layer or have multiple layers. In an embodiment, the encapsulation layer TFE includes first to third encapsulation layers ENC1, ENC2, and ENC3. The first to third encapsulation layers ENC1, ENC2, and ENC3 are made of an organic material and an inorganic material. The third encapsulation layer ENC3 located at the outermost side of the encapsulation layer TFE is made of an inorganic material. In an embodiment of the present disclosure, the first encapsulation layer ENC1 is made of an inorganic material, the second encapsulation layer ENC2 is made of an organic material, and the third encapsulation layer ENC3 is made of an inorganic material. As compared with the organic material, moisture or oxygen penetrate less into the inorganic material, but the inorganic material is weak, and cracks due to its inflexibility. The first encapsulation layer ENC1 and the third encapsulation layer ENC3 are formed of an inorganic material, and the second encapsulation layer ENC2 is formed of an organic material, so that the propagation of cracks can be prevented. The organic material layer, i.e., the second encapsulation layer ENC2, is completely covered by the third encapsulation layer ENC3 such that an end portion of the second encapsulation layer ENC2 is not externally exposed. The organic material includes an organic insulating material such as a polyacryl-based compound, a polyimide-based compound, a fluorine-based compound such as Teflon, or a benzocyclobutene-based compound. The inorganic material includes inorganic insulating materials such as polysiloxane, silicon nitride, silicon oxide, or sircon oxynitride.

In an embodiment, the encapsulation layer TFE covers the display region DA, and extends to the outside of the display region DA.

In an embodiment, the third insulating layer INS3, the fourth insulating layer INS4 or the pixel defining layer PDL, which are made of an organic material continuously extend to the connection region CA, and have a first opening OPN1 formed by removing a portion of the display region DA along the circumference of the display region DA. Accordingly, an upper surface of the pixel defining layer PDL and side surfaces of the third insulating layer INS3, the fourth insulating layer INS4, or the pixel defining layer PDL, which are exposed by the first opening OPN1, are encapsulated by an insulating layer that includes an inorganic material, such as the encapsulation layer TFE, so that external exposure of the third insulating layer INS3, the fourth insulating layer INS4, or the pixel defining layer PDL can be prevented.

In an embodiment, a first sensing electrode IE1 and a second sensing electrode IE2 are disposed on the encapsulation layer TFE. A first sensing line SL1 connected to the first sensing electrode IE1 and a second sensing line SL2 connected to the second sensing electrode IE2 are disposed on the encapsulation layer TFE.

In an embodiment, each of the first sensing electrode IE1, the second sensing electrode IE2, the first sensing line SL1, and the second sensing line SL2 may have a single- or multi-layered structure. When each of the first sensing electrode IE1, the second sensing electrode IE2, the first sensing line SL1, and the second sensing line SL2 has a single-layered structure, these components include a metal layer or a transparent conductive layer. The metal layer includes molybdenum, silver, titanium, copper, aluminum, or alloys thereof. The transparent conductive layer includes a transparent conductive oxide such as indium tin oxide (ITO), indium zinc oxide (IZO), zinc oxide (ZnO), or indium tin zinc oxide (ITZO). In addition, the transparent conductive layer includes a conductive polymer such as PEDOT, metal nano wire, graphene, etc. When each of the first sensing electrode IE1, the second sensing electrode IE2, the first sensing line SL1, and the second sensing line SL2 has a multi-layered structure, these components include multi-layered metal layers. The multi-layered metal layers may have a triple structure of, for example, titanium/aluminum/titanium.

In an embodiment, each of the first sensing electrode IE1, the second sensing electrode IE2, the first sensing line SL1, and the second sensing line SL2 has a mesh pattern that includes a plurality of mesh holes.

In an embodiment, each of the first sensing electrode IE1, the second sensing electrode IE2, the first sensing line SL1, and the second sensing line SL2 overlaps with the pixel defining layer PDL.

Next, the non-display region NDA will be described. Hereinafter, when the non-display region NDA is described, descriptions of those portions that have already been described will be omitted or be briefly described to avoid redundancy.

As shown in FIG. 5, according to an embodiment, the non-display region NDA includes an encapsulation region EA adjacent to the display region DA, a connection region CA, a bent region BA in which the substrate SUB is folded, and a second flat region FA2.

In an embodiment, a dam part DPP is further disposed in the encapsulation region EA of the non-display region NDA. The dam part DPP surrounds the display region DA. The dam part DPP is disposed inward of the connection region CA.

In an embodiment, the dam part DPP has a double-layered structure. For example, a lower dam part DPP1 is simultaneously formed with the third insulating layer INS3 or INS', and an upper dam part DPP2 is simultaneously formed with the pixel defining layer PDL.

In an embodiment, the dam part DPP prevents a liquid organic material from spreading out from the lower insulating layers, such as the first insulating layer INS1 etc., in a process of forming the second encapsulation layer EC2.

However, this is merely illustrative. In some embodiments, the dam part DPP may be omitted, and a plurality of dam parts may be disposed.

In an embodiment, conductive lines CL include scan lines, data lines, power lines, etc. The conductive line CL shown in FIG. 5 is a data line. However, embodiments are not limited thereto, and different types of conductive line CL may be disposed on the first insulating layer INS1 in other embodiments.

In an embodiment, a sensing line, such as the first sensing line SL1-1 of FIG. 4, include a plurality of sensing line patterns SLP1 to SLP3. The sensing line SL1-1 is connected to a sensing electrode, such as the first sensing electrode IE1, on the encapsulation layer TFE. The sensing line SL1-1 connects the sensing electrode IE1 and the driver. To this end, the sensing line SL1-1 extends approximately in the first direction DR1 from the sensing electrode IE1. The lines extend up to an end portion of the additional region ADA in the first direction DR1, and contact electrodes CTE are provided at the end portion. The sensing electrode IE1 is connected by the sensing line SL1-1 to the driver through the contact electrodes CTE.

In an embodiment, the sensing line SL1-1 includes first to third sensing line patterns SLP1 to SLP3. The first sensing line pattern SLP1 and the second sensing line pattern SLP2 are connected one-to-one. The third sensing line pattern SLP3 electrically connects one second sensing line pattern SLP2 and a plurality of fourth sensing line patterns SLP4 of FIG. 4. That is, a plurality of sensing lines are connected by the third sensing line pattern SLP3.

In an embodiment, the buffer layer BF is disposed in the non-display region NDA on the substrate SUB. The buffer layer BF has a third opening OPN3 in the bent region BA.

In an embodiment, the gate insulating layer GI is disposed on the buffer layer BF.

In an embodiment, the third sensing line pattern SLP3 is disposed on the gate insulating layer GI. In addition, a line L1 disposed in the second flat region FA2 is further disposed on the gate insulating layer GI. The third sensing line SLP3 and the additional line L1 are formed of the same material through the same process as the gate electrode GE.

In an embodiment, the third sensing line pattern SLP3 is disposed in the encapsulation region EA, and extends approximately in the second direction DR2. The third sensing line pattern SLP3 does not overlap the second encapsulation layer EC2. For example, the third sensing line pattern SLP3 is disposed between the dam part DPP and the connection region CA.

In an embodiment, the interlayer insulating layer IL is disposed over the third sensing line pattern SLP3, and the first insulating layer INS1 is disposed on the interlayer insulating layer IL.

In an embodiment, the third opening OPN3 is formed in the insulating layers disposed in the bent region BA. The bent region BA is a region in which the substrate SUB is bent. That is, parts of the buffer layer BF, the gate insulating layer GI, the interlayer insulating layer IL, and the first insulating layer INS1 corresponding to the bent region BA are removed, thereby forming the third opening OPN3.

In an embodiment, the width of the third opening OPN3 is wider than that of the bent region BA. FIG. 5 illustrates a case where the width of the third opening OPN3 is equal to that of the bent region BA. However, this is for purposes of description, and embodiments are not limited thereto. The width of the third opening OPN3 may be larger than that of the bent region BA in other embodiments.

In an embodiment, the second insulating layer INS2 is disposed in the third opening OPN3. The second insulating layer INS2 fills at least a portion of the third opening OPN3. FIG. 5 illustrates that the second insulating layer INS2 entirely fills the third opening OPN3. The second insulating layer INS2 covers a portion of the top of the first insulating layer INS1, in a region adjacent to the third opening OP3, such as the connection region CA and/or the second flat region FA2.

In an embodiment, the second insulating layer INS2 is an organic insulating layer made of an organic material. The organic material includes an organic insulating material such as a polyacryl-based compound, a polyimide-based compound, a fluorine-based compound such as Teflon, or a benzocyclobutene-based compound.

In an embodiment, the second sensing line pattern SLP2 is disposed on the first insulating layer INS1 and the second insulating layer INS2. A first connection part CP1 of the second sensing line pattern SLP2 extends up to the second flat region FA2 via the bent region BA. A second connection part CP2 of the second sensing line pattern CP2 extends from bent region BA through the connection region to the encapsulation region EA. In addition, conductive lines CL, such as data lines, are disposed on the first insulating layer INS1 and the second insulating layer INS2. Conductive lines, such as scan lines, power lines, etc., disposed on other insulating layers make contact with the first and second insulating layers INS1 and INS2 through a contact hole, and extend to the second flat region FA2 on the same layer in the connection region CA and/or the bent region BA. The conductive lines CL and the second sensing line pattern SLP2 are not in contact with each other but extend spaced apart from each other.

In addition, in an embodiment, lower contact electrodes CTEa are disposed on the first insulating layer INS1. The second sensing line pattern SLP2 and the lower contact electrode CTEa are formed of the same material through the same process as the source electrode SE and the drain electrode DE. The second sensing line pattern SLP2 is disposed on the second insulating layer INS2. The second sensing line pattern SLP2 is disposed on t he first insulating layer INS1 at a portion where there is no second insulating layer INS2.

In an embodiment, a first contact hole CH1 that penetrates the interlayer insulating layer IL and the gate insulating layer GI is formed and overlaps one end portion of the second connection part CP2 of the second sensing line pattern SLP2. The second sensing line pattern SLP2 is connected to the third sensing line pattern SLP3 through the first contact hole CH1. The first contact hole CH1 is formed in the encapsulation region EA. For example, the first contact hole CH does not overlap the second encapsulation layer EC2. The first contact hole CH1 is formed outward from the second encapsulation layer EC2. In addition, one end of the second sensing line pattern SLP2 does not overlap the second encapsulation layer EC2.

Similarly, in an embodiment, a second contact hole CH2 that connects the third sensing line pattern SLP3 and the fourth sensing line pattern SLP4 of FIG. 4 is also formed in the encapsulation region EA. The second contact hole CH2 does not overlap the second encapsulation layer EC2. In addition, the second end portion of the fourth sensing line pattern SLP4 does not overlap the second encapsulation layer EC2.

In an embodiment, the passivation layer PSV is disposed on the second sensing line pattern SLP2. The passivation layer PSV is an inorganic insulating layer, and is not disposed in the bent region BA.

In an embodiment, the passivation layer PSV exposes a partial upper surface of t he lower contact electrode CTEa. The fourth insulating layer INS4 is disposed on the third insulating layer INS3. The first opening OPN1 is formed between the third insulating layer INS3 and the fourth insulating layer INS4.

In an embodiment, side surfaces of the third insulating layer INS3 and the fourth insulating layer INS4 adjacent to a side of the display region DA, are covered by the encapsulation layer TFE, but an upper surface of a fourth insulating layer INS4' and side surfaces of the fourth insulating layer INS4' the third insulating layer INS3' outside of the encapsulation region EA are externally exposed. However, the third insulating layer INS3' and the fourth insulating layer INS4' outside of the encapsulation region EA may be formed through a different process from that which forms the third insulating layer INS3 and the fourth insulating layer INS4 inside of the encapsulation region EA.

In an embodiment, after the third insulating layer INS3 is formed, an upper contact electrode CTEb is formed. The upper contact electrode CTEb is formed of the same material through the same process as the connection pattern CNP of the display region DA. The lower contact electrode CTEa and the upper contact electrode CTEb constitute a contact electrode CTE, and lines are connected to the driver through the contact electrode CTE.

In an embodiment, in the connection region CA, the passivation layer PSV, the third insulating layer INS3' and the fourth insulating layer INS4' outside of the encapsulation region EA have a second opening OPN2. Accordingly, a portion of the second sensing line pattern SLP2 is exposed through the second opening OPN2. The exposed portion of the second sensing line pattern SLP2 forms the first pad part PD1.

In an embodiment, the first sensing line pattern SLP1 is disposed on the encapsulation layer TFE that covers the third and fourth insulating layers INS3 and INS4 and the pixel defining layer PDL. The first sensing line pattern SLP1 extends along a surface of the encapsulation layer TFE. In addition, the first sensing line pattern SLP1 extend into the connection region CA, and is disposed along the surface of an exposed uppermost layer in a region in which there is no encapsulation layer TFE. For example, as shown in FIG. 5, the first sensing line pattern SLP1 is formed along a side surface of the third insulating layer INS3' outside of the encapsulation region EA and side and upper surfaces of the fourth insulating layer INS4' outside of the encapsulation region EA in the connection region CA.

In an embodiment, one end portion of the first sensing line pattern SLP1 forms the first pad part PD1, and is connected to the second pad part PD2 of the second sensing line pattern SLP2 at the first pad part PD1.

As described above, in an embodiment, the third sensing line pattern SLP3 in the sensing line SL1-1 connects a plurality of sensing lines in the encapsulation region EA, so that one sensing line SL1-1 of the connected sensing lines includes the first connection part CP1 of the second sensing line pattern SLP2 that extends to the bent region BA. Thus, the number of sensing lines that extend to the bent region BA and the second flat region FA2 is decreased to no more than ¼ of the number of the existing sensing lines, and the degree of integration of the lines in the bent region BA can be reduced.

Figure 7:
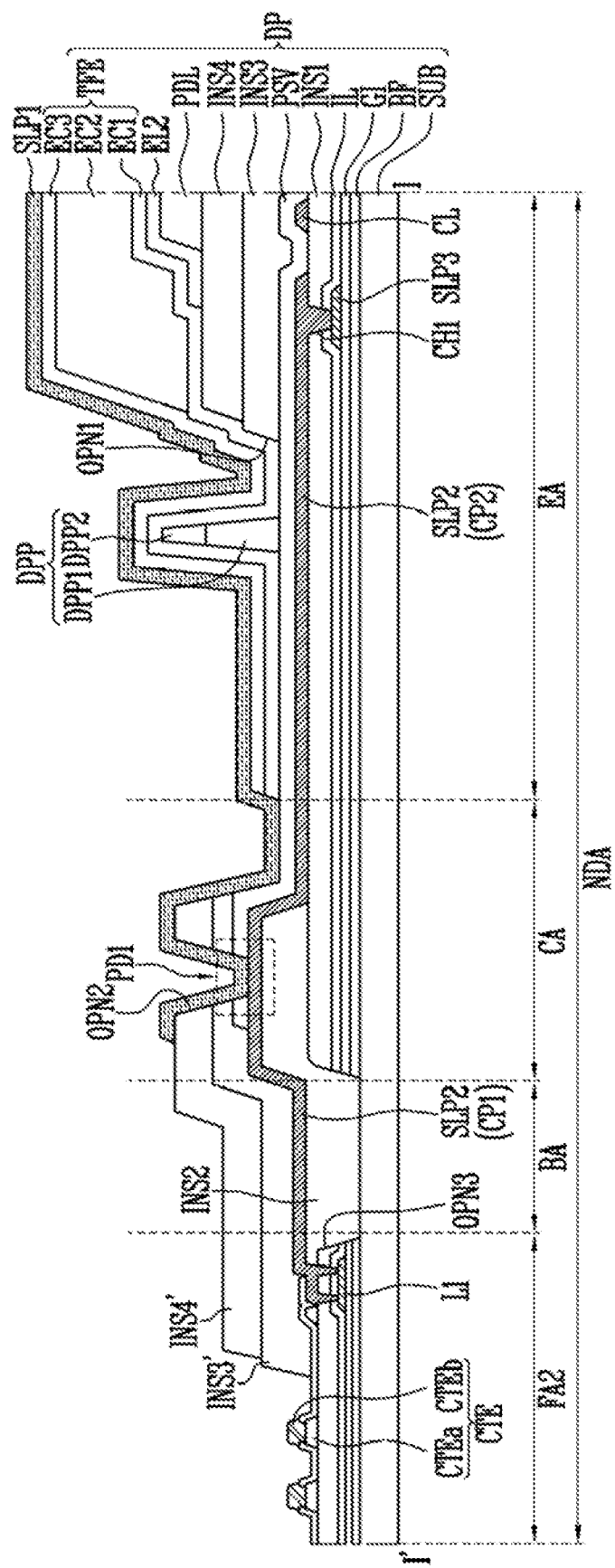
FIG. 7 is a sectional view of an example taken along the line I-I' of FIG. 1A.

FIG. 7 is a sectional view of an example taken along the line I-I' of FIG. 1A.

In FIG. 7, components identical to those described with reference to FIGS. 5 and 6 are designated by like reference numerals, and repetitive descriptions thereof will be omitted. A display device of FIG. 7 has a configuration substantially identical or similar to that of a display device of FIG. 5, except for a position at which a second sensing line pattern SLP2 and a third sensing line pattern SLP3 are connected to each other.

Referring to FIGS. 1A, 5, and 7, in an embodiment, the display device DD includes a display panel DP and a touch sensor TS. The display device DD includes a display region DA and a non-display region NDA.

In an embodiment, the non-display region NDA includes an encapsulation region EA adjacent to the display region DA, a connection region CA, a bent region BA in which a substrate SUB is bent, and a second flat region FA2.

In an embodiment, a sensing line includes a plurality of sensing line patterns SLP1 to SLP3.

In an embodiment, a first sensing line pattern SLP1 and a second sensing line pattern SLP2 are connected one-to-one. A third sensing line pattern SLP3 electrically connects one second sensing line pattern SLP2 and a plurality of fourth sensing line patterns SLP4 of FIG. 4. That is, a plurality of sensing lines are connected by the third sensing line pattern SLP3.

In an embodiment, the third sensing line pattern SLP3 is disposed in the encapsulation region EA, and extends approximately in the second direction DR2. The third sensing line pattern SLP3 overlaps a second encapsulation layer EC2. For example, the third sensing line pattern SLP3 is disposed under a pixel defining layer PDL and the second encapsulation layer EC2.

In an embodiment, the second sensing line pattern SLP2 is connected to the third sensing line pattern SLP3 through a first contact hole CH1 that penetrates an interlayer insulating layer IL and a gate insulating layer GI. The first contact hole CH1 is formed in the encapsulation region EA. For example, the first contact hole CH1 overlaps the second encapsulation layer EC2.

Figure 8:
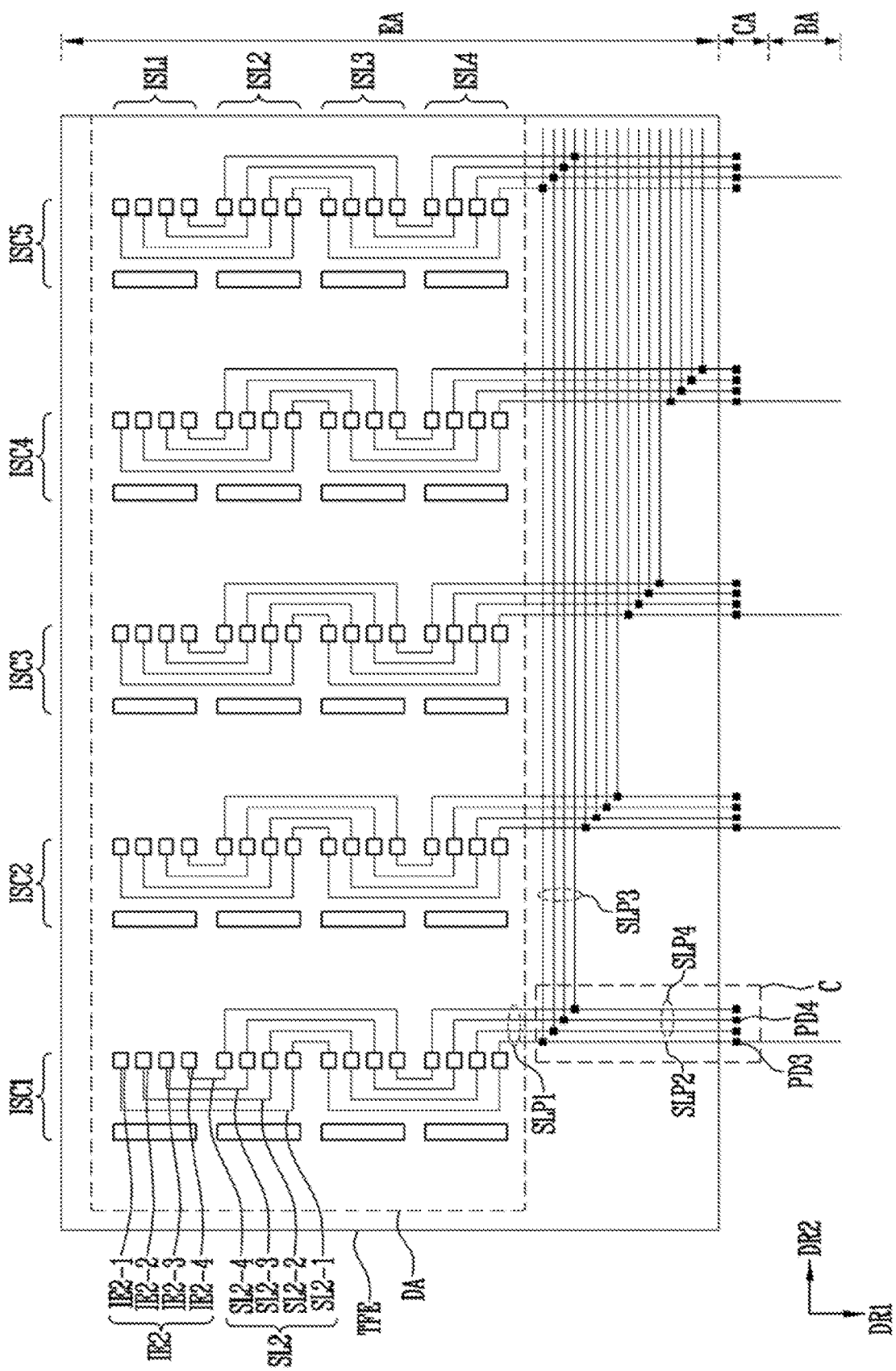
FIG. 8 illustrates an example of a touch sensor of FIG. 3.
Figure 9:
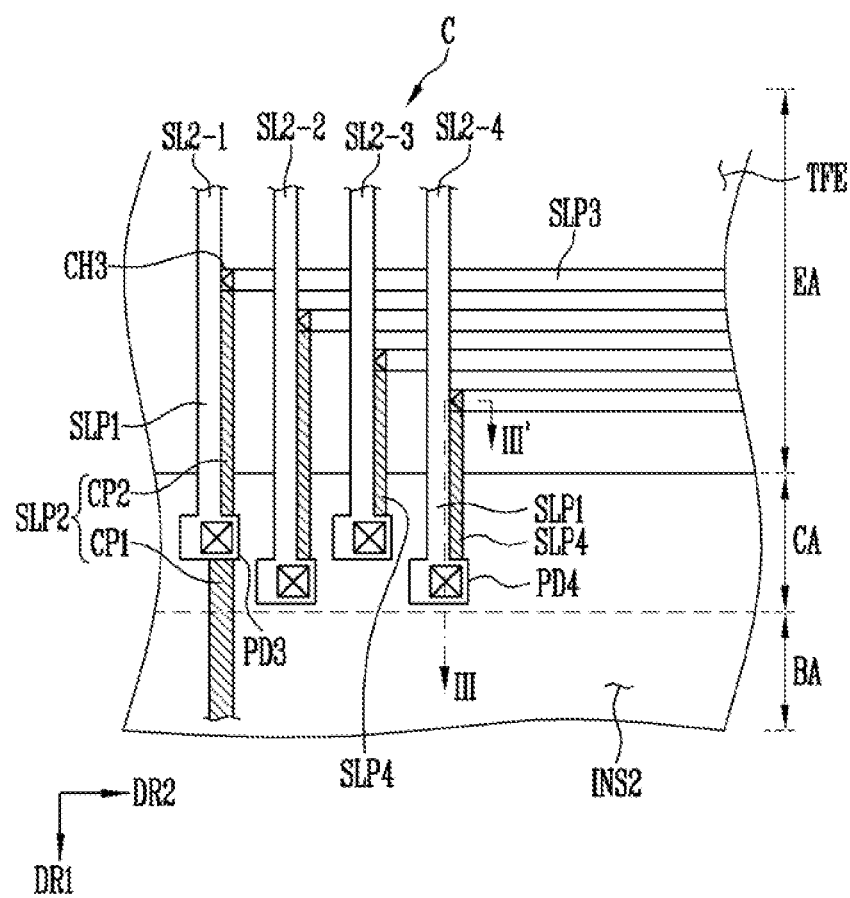
FIG. 9 is a plan view of an example of portion C of FIG. 8.

FIG. 8 illustrates an example of the touch sensor of FIG. 3. FIG. 9 is a plan view of an example of portion C of FIG. 8.

For convenience of descriptions, only the second sensing lines SL2 connected to a second sensing electrode IE2 are illustrated in FIG. 8. In FIGS. 8 and 9, components identical to those described with reference to FIGS. 3 and 4 are designated by like reference numerals, and repetitive descriptions thereof will be omitted.

Referring to FIGS. 2 to 9, according to an embodiment, second sensing lines SL2-1 to SL2-4 are connected to second sensing electrodes IE2-1 to IE2-4.

FIG. 8 illustrates that the second sensing electrodes IE2-1 to IE2-4 are not connected to each other but transmit signals separate from each other.

In an embodiment, second sensing electrodes IE2 disposed in a first sensor column ISC1 and second sensor electrodes IE2 disposed in a fifth sensor column ISC5 are connected to each other. For example, the second sensing electrode IE2-2 of the first sensor column ISC1 is connected to the second sensing electrode IE2-2 of the fifth sensor column ISC5 through a third sensing line pattern SLP3. In addition, the second sensing electrode IE2-2 of the first sensor column ISC1 is connected to a second sensing electrode IE2-2 of a ninth sensor column and a second sensing electrode IE2-2 of a thirteenth sensor column. i second sensing electrodes IE2 are connected to each other at a distance of i sensor columns.

Accordingly, in an embodiment, the second sensing lines extend into the bent region BA at a ratio of i:1.

In an embodiment, one second sensing line SL2 extends in to the bent region BA in one sensor column. However, this is merely illustrative, and in some embodiments, a plurality of second sensing lines SL2 extend into the bent region BA in one sensor column, so that the second sensing lines SL2 do not extend into the bent region BA in a predetermined sensor column.

That is, according to embodiments, some of the second sensing lines SL2, such as SL2-1 of FIG. 7, include first to third sensing line patterns SLP1 to SLP3, and the others of the second sensing lines SL2, such as SL2-2, SL2-3, and SL2-4, include first and fourth sensing line patterns SLP1 and SLP4.

Hereinafter, a configuration of the second sensing lines SL2-1 to SL2-4 will be described with reference to FIG. 9.

In an embodiment, the first sensing line pattern SLP1, the second sensing line pattern SLP2, and the third sensing line pattern SLP3 are disposed on different insulating layers. In addition, the fourth sensing line pattern SLP4 is disposed on the same layer as the second sensing line pattern SLP2. The configuration of the first to fourth sensing line patterns SLP1 to SLP4 is similar to that of the first sensing line SL1.

In an embodiment, the first sensing line pattern SLP1 connected to the second sensing electrode IE2 extends past one end of an encapsulation layer TFE on the encapsulation layer TFE and then extends to a substrate. One end of the first sensing line pattern SLP1 is disposed in the connection region CA. One end of a (2-1)th sensing line SL2-1 of the first sensing line pattern SLP1 is connected to the second sensing line pattern SLP2 at a third pad part PD3. One of each of (2-2)th to (2-4)th sensing lines SL2-2 to SL2-4 end of the first sensing line pattern SLP1 is connected to the fourth sensing line pattern SLP4. Each of the (2-2)th to (2-4)th sensing lines SL2-2 to SL2-4 includes a fourth pad part PD4, and the first sensing line pattern SLP1 and the fourth sensing line pattern SLP4 are connected through the fourth pad part PD4. Third and fourth pad parts PD3 and PD4, which are adjacent to each other, are disposed to alternate with each other with respect to the second direction DR2.

In an embodiment, the second sensing line pattern SLP2 is connected to the first sensing line pattern SLP1 in the connection region CA. The second sensing line pattern SLP2 includes a first connection part CP1 extending in the first direction DR1 and a second connection part CP2 extending in the direction opposite to the first direction DRI to extend under the encapsulation layer TFE. The first connection part CP1 and the second connection part CP2 are formed of the same material through the same process.

In an embodiment, the first part CP1 of the second sensing line pattern SLP2 extends while avoiding other conductive lines CL in the encapsulation region EA.

In an embodiment, the third sensing line pattern SLP3 is connected to the second connection part CP2 of the second sensing line pattern SLP2 under the encapsulation layer TFE, and extends in the second direction DR2. The third sensing line pattern SLP3 is disposed in a different insulating layer from that of the second sensing line pattern SLP. One end portion of the second connection part CP2 and the third sensing line pattern SLP3 are connected to each other through a third contact hole CH3.

In an embodiment, the third contact hole CH3 is formed in the encapsulation region EA. In addition, the third sensing line pattern SLP3 is disposed in only the encapsulation region EA. Accordingly, a plurality of second sensing lines SL2 disposed in different sensor columns are electrically connected in the encapsulation region EA. The third sensing line pattern SLP3 extends while avoiding other conductive lines CL.

In an embodiment, the fourth sensing line pattern SLP4 is connected to the first sensing line pattern SLP1 in the connection region CA. The fourth sensing line pattern SLP4 extends in the direction opposite to the first direction DR1 from the fourth pad part PD4. The fourth sensing line pattern SLP4 is connected to the third sensing line pattern SLP3 through a contact hole. The fourth sensing line pattern SLP4 extends while avoiding other conductive lines CL.

FIGS. 10 to 13 are sectional views schematically illustrating examples taken along line III-III' of FIG. 9.

In FIGS. 10 to 13, components identical to those described with reference to FIGS. 5 and 6 are designated by like reference numerals, and repetitive descriptions thereof will be omitted.

Although a case where the sensing line SL2-4 includes a fourth sensing line pattern SLP4 is illustrated in FIGS, 10 to 13, embodiments of the present disclosure are not limited thereto. For example, the sensing line SL2-4 may include a second sensing line pattern SLP2 that extends into the bent region BA on a second insulating layer INS2, instead of the fourth sensing line pattern LSP4.

Referring to FIGS. 5, 6, and 9 to 13, according to an embodiment, the sensing line SL2-4 of the first sensing line pattern SLP1 extends from the display region DA to the connection region CA.

In an embodiment, conductive lines CL1 to CL4 transmit predetermined signals to each pixel PX.

In an embodiment, a first conductive line CL1 is formed of the same material through the same process as a gate electrode GE on a gate insulating layer GI. For example, the first conductive line CL1 is provided as a lower electrode LE of a storage capacitor Cst or a scan line.

In an embodiment, a second conductive line CL2 is formed on an interlayer insulating layer IL, and is provided as an upper electrode UE of the storage capacitor Cst, etc.

In an embodiment a third conductive line CL3 is formed of the same material through the same process as a source electrode SE and a drain electrode DE on a first insulating layer INS1. For example, the third conductive line CL3 may be a line that transmits an initialization voltage or a line that transmits a predetermined gate signal.

In an embodiment, a fourth conductive line CL4 is formed of the same material through the same process as a connection pattern CNP on the passivation layer PSV. For example, the fourth conductive line CL4 is provided as an initialization data line etc.

However, this is merely illustrative, and the arrangement and function of the first to fourth conductive lines CL1 to CL4 are not limited thereto. In other embodiments, the first to fourth conductive lines CL1 to CL4 may be any one of a scan line, a data line, or a voltage supply line. In addition, conductive lines may be omitted on some insulating layers.

In an embodiment, the first to fourth conductive lines CL1 to CL4 make contact with the first insulating layer INS1 and the second insulating layer INS2 through a contact hole in the non-display region NDA, and extend into the second flat region FA2 on the same layer in the connection region CA and the bent region BA. The first to fourth conductive lines CL1 to CL4 and the fourth sensing line pattern SLP4 do not in contact with each other.

In an embodiment, a light emitting element DP-OLED that includes a first electrode EL1, an emitting layer OL, a second electrode EL2, and a pixel defining layer PDL is disposed on a fourth insulating layer INS4. An encapsulation layer TFE is disposed that covers the light emitting element DP-OLED.

In an embodiment, the sensing line SL2-4 includes a first sensing line pattern SLP1 and a fourth sensing line pattern SLP4, and is connected to a third sensing line pattern SLP3.

In an embodiment, the fourth sensing line pattern SLP4 connected to the first sensing line pattern SLP1 in the connection region CA is disposed on the first insulating layer INS1. For example, the fourth sensing line pattern SLP4 is formed of the same material through the same process as the source electrode SE and the drain electrode DE.

Figure 10:
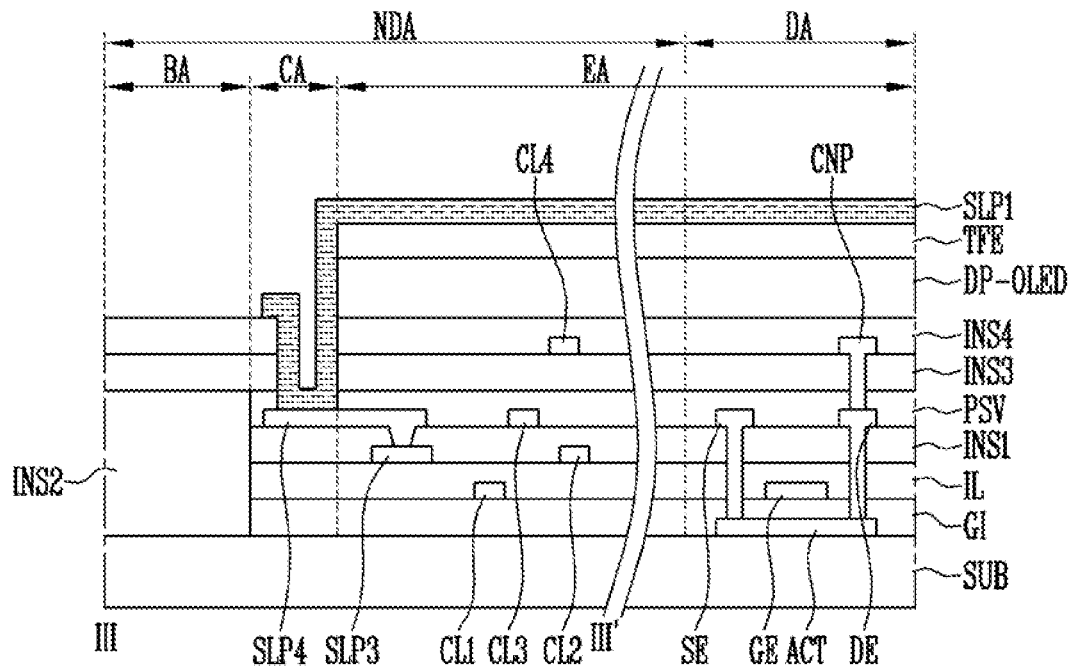
FIGS. 10 to 13 are sectional views of examples taken along line III-III' of FIG. 9.

In an embodiment, as shown in FIG. 10, the third sensing line pattern SLP3 is disposed on the interlayer insulating layer IL. For example, the third sensing line pattern SLP3 is formed of the same material through the same process as the upper electrode UE of the storage capacitor. The third sensing line pattern SLP3 and the fourth sensing line pattern SLP4 are connected through a contact hole that penetrates the first insulating layer INS1.

Figure 11:
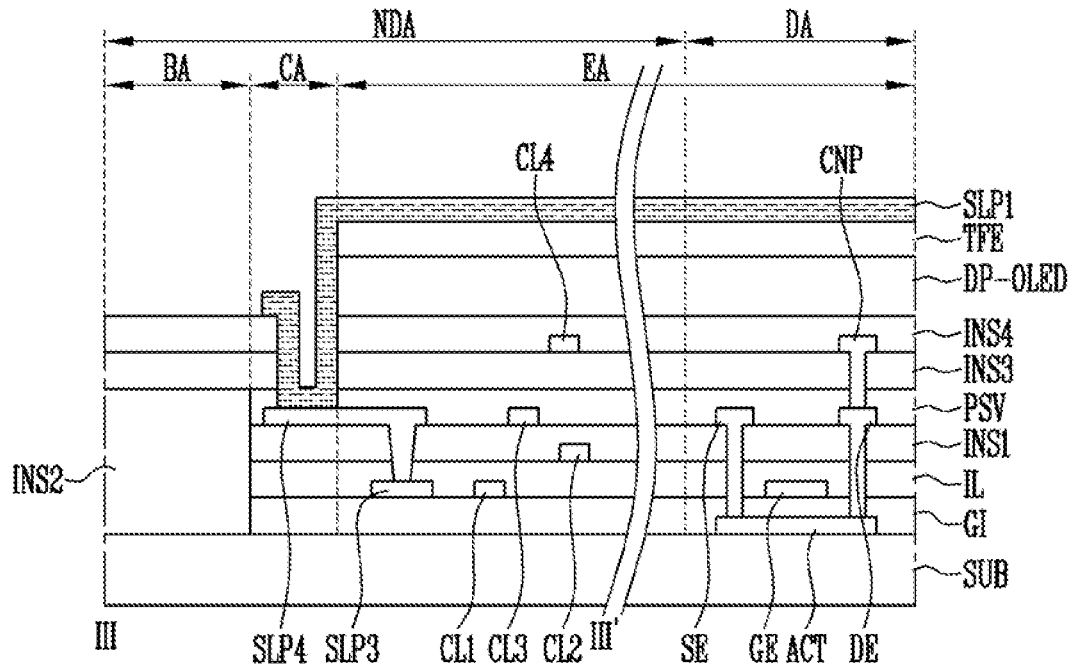

In an embodiment, as shown in FIG. 11, the third sensing line pattern SLP3 is disposed on the gate, insulating layer GI. For example the third sensing line pattern SLP3 is formed of t he same material through the same process as the upper electrode UE of the storage capacitor. The third sensing line pattern SLP3 and the fourth sensing line pattern SLP4 are connected through a contact hole that penetrates the first insulating layer INS and the gate insulating layer GI.

Figure 12:
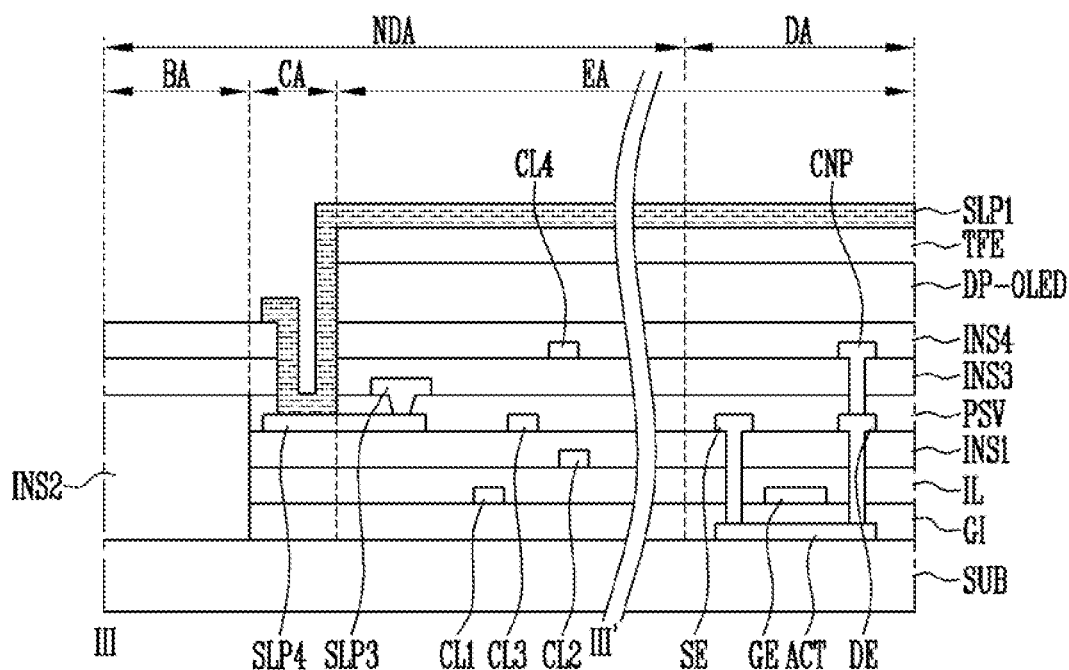

In an embodiment, as shown in FIG. 12 the third sensing line pattern SLP3 is disposed on the passivation layer PSV. The third sensing line pattern SLP3 and the fourth sensing line pattern SLP4 are connected through a contact hole that penetrates the passivation layer PSV.

Figure 13:
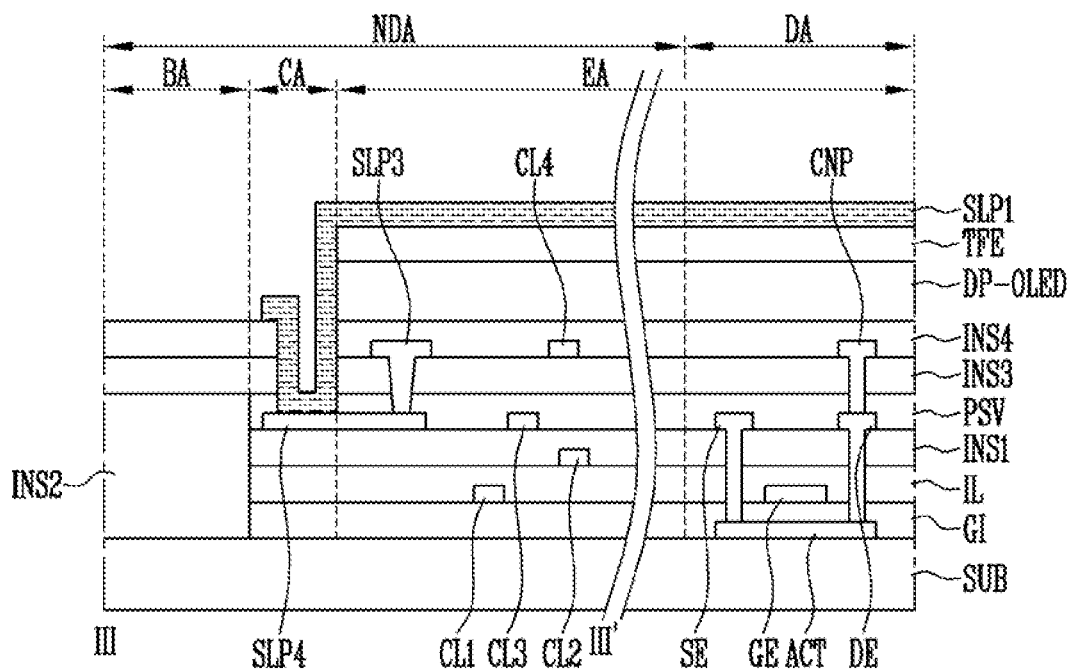

In an embodiment, as shown in FIG. 13, the third sensing line pattern SLP3 is disposed, on the third insulating layer INS3. The third sensing line pattern SLP3 and the fourth sensing line pattern SLP4 are connected through a contact hole that penetrates the passivation layer PSV and the third insulating layer INS3.

However, this is merely illustrative, and the vertical stacking relationship of the third and fourth sensing line patterns SLP3 and SLP4 is not limited thereto in other embodiments.

As described above, a display device according to embodiments of the present disclosure includes sensing lines SL1 and SL2 that include second and fourth sensing line patterns SLP2 and SLP4 that extend into the encapsulation region EA and a third sensing line pattern SLP3 that connects the second and fourth sensing line patterns SLP2 and SLP4 in the encapsulation region EA and is disposed on an insulating layer different from that of the second and fourth sensing line patterns SLP2 and SLP4, so that the number of sensing lines that extend into the bent region BA and the second flat region FA2 can be reduced. Thus, the degree of line integration in the bent region BA can be reduced, and the number of pads of the touch sensor TS and the area of a dead space of the display panel can be decreased.

Further, the width of the additional region ADA of FIG. 1 in the second direction DR2 can be reduced due to the reduced number of lines in the bent region BA. Accordingly, both side portions of the display device DD, which are not connected to the additional region ADA, can be more easily bent or folded, e.g., to form a curved edge or a bent edge.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and elements described in connection with a particular embodiment may be used singly or in combination with features, characteristics, or elements described in connection with other embodiments unless otherwise specifically indicated. Accordingly, it will be understood by those of skill in the art that various changes in form and details may be made without departing from the spirit and scope of embodiments of the present disclosure as set forth in the following claims.

What is claimed is:

1. A display device, comprising:
a display panel that includes a substrate, a pixel disposed on the substrate, and an encapsulation layer that covers the pixel, the display panel including a display region that includes the pixel, an encapsulation region that corresponds to a position of the encapsulation layer, and a non-display region provided at at least one side of the display region; and
a touch sensor disposed on the display panel,
wherein the touch sensor includes:
sensing electrodes disposed on the encapsulation layer; and
sensing lines respectively connected to the sensing electrodes on the encapsulation layer,
wherein some of the sensing lines include:
a first sensing line pattern that extends from one end of the encapsulation layer and onto the substrate;
a second sensing line pattern connected to the first sensing line pattern outside of the encapsulation region, the second sensing line pattern including a first connection part that extends in a first direction and a second connection part that extends in a direction opposite to the first direction to a lower side of the encapsulation layer; and
a third sensing line pattern connected to the second connection part of the second sensing line pattern at the lower side of the encapsulation layer, the third sensing line pattern extending in a second direction that crosses the first direction.

2. The display device of claim 1, wherein the first sensing line pattern, the second sensing line pattern, and the third sensing line pattern are disposed on different insulating layers, and
wherein the third sensing line pattern is disposed in the encapsulation region.

3. The display device of claim 1, wherein the display panel further includes:
at least one insulating layer interposed between the second sensing line pattern and the third sensing line pattern,
wherein the at least one insulating layer has a contact hole that overlaps one end portion of the second connection part, and
wherein t he one end portion of the second connection part and the third sensing line pattern are connected to each other through the contact hole.

4. The display device of claim 3, wherein the contact hole is formed in the encapsulation region.

5. The display device of claim 1, wherein other sensing lines include:
the first sensing line pattern; and
a fourth sensing line pattern that includes a first end portion connected to the first sensing line pattern outside of the encapsulation region, the fourth sensing line pattern extending in the direction opposite to the first direction.

6. The display device of claim 5, wherein the fourth sensing line pattern further includes a second end portion connected to the third sensing line pattern.

7. The display device of claim 6, wherein the second sensing line pattern and the fourth sensing line pattern are disposed on the same layer.

8. The display device of claim 5, wherein the non-display region of the display panel includes a bent region at one side of the non-display region and a connect on region between the encapsulation region and the bent region.

9. The display device of claim 8, wherein the first sensing line pattern extends to the connection region,
wherein one end portion of the first sensing line pattern includes a first pad disposed in the connection region.

10. The display device of claim 9, wherein the second sensing line pattern includes a second pad disposed between the first connection part and the second connection part,
wherein, when viewed on a plane, the first pad and the second pad corresponding thereto overlap each other.

11. The display device of claim 10, wherein the display panel further includes:
at least one insulating layer interposed between the first sensing line pattern and the second sensing fine pattern,
wherein the at least one insulating layer has a contact hole where the first pad and the second pad overlap each other, and
wherein the first pad and the second pad are connected to each other through the contact hole.

12. The display device of claim 9, wherein the first end portion of the fourth sensing line pattern includes a third pad disposed in the connection region.

13. The display device of claim 12, wherein the display panel further includes:
at least one insulating layer interposed between the first sensing line pattern and the fourth sensing line pattern, the at least one insulating layer having a contact hole where the first pad and the third pad overlap each other, and
wherein the first pad and the third pad are connected to each other through the contact hole.

14. The display device of claim 8, wherein the first connection part of the second sensing line pattern extends into the bent region.

15. The display device of claim 5, wherein the third sensing line pattern is connected to one second sensing line pattern and a plurality of fourth sensing line patterns.

16. The display device of claim 5, wherein the sensing electrodes form a plurality of sensor blocks,
wherein each of the sensor blocks includes:
a first sensing electrode; and
i second sensing electrodes arranged in a column direction while being spaced apart from the first sensing electrode, wherein i is a natural number greater than 1,
wherein the sensing lines include:
a plurality of first sensing lines each connected to the first sensing electrode, and
a plurality of second sensing lines each connecting a jth second sensing electrode of an nth sensor block and an (i−j+1)th second sensing electrode of an (n+1)th sensor block, wherein j is a natural number that is greater than or equal to 1 and less than or equal to i, and n is a natural number.

17. The display device of claim 16, wherein one group of the first sensing lines includes the first, second, and third sensing line patterns, and an other group of the first sensing lines includes the first, and fourth sensing line patterns, and
one group of the second sensing lines includes the first, and third sensing line patterns, and an other group of the second sensing lines includes the first, second, and fourth sensing line patterns.

18. The display device of claim 1, wherein the pixel includes:
- a gate electrode disposed on the substrate;
- a first insulating layer that covers the gate electrode; and
- a source electrode and a drain electrode disposed on the first insulating layer,
- wherein the second sensing line pattern is disposed on the same layer as the source electrode and the drain electrode, and
- the third sensing line pattern is disposed on the same layer as the gate electrode.

19. A display device comprising:
- a display panel that includes a display region and an encapsulation region that corresponds to an encapsulation layer that covers the display region; and
- a touch sensor disposed in the encapsulation region,
- wherein the touch sensor includes:
- sensing electrodes disposed on the encapsulation layer; and
- sensing lines respectively connected to the sensing electrodes on the encapsulation layer,
- wherein some of the sensing lines include:
  - a first sensing line pattern that extends away from one end of the encapsulation layer;
  - a second sensing line pattern connected to the first sensing line pattern outside of the encapsulation region, the second sensing line pattern including a first connection part that extends in a first direction and a second connection part that extends in a direction opposite to the first direction to a lower side of the encapsulation layer; and
  - a third sensing line pattern connected to the second connection part of the second sensing line pattern at the lower side of the encapsulation layer, the third sensing line pattern extending in a second direction that crosses the first direction,
- wherein other of the sensing lines include:
  - the first sensing line pattern; and
  - a fourth sensing line pattern that includes a first end portion connected to the first sensing line pattern outside of the encapsulation region, the fourth sensing line pattern extending in the direction opposite to the first direction.

20. The display device of claim 19, further comprising: a substrate, a pixel disposed on the substrate, wherein the display region includes the pixel and the encapsulation layer covers the pixel; and a non-display region provided at at least one side of the display region,
- wherein the fourth sensing line pattern further includes a second end portion connected to the third sensing line pattern,
- wherein t he second sensing line pattern and the fourth sensing line pattern are disposed on the same layer, and
- wherein the third sensing line pattern is connected to one second sensing line pattern and a plurality of fourth sensing line patterns.

* * * * *